(12) United States Patent
Shirai et al.

(10) Patent No.: US 6,711,522 B2
(45) Date of Patent: Mar. 23, 2004

(54) DATA ANALYSIS APPARATUS, DATA ANALYSIS METHOD, AND COMPUTER PRODUCTS

(75) Inventors: Hidehiro Shirai, Kawasaki (JP); Hidetaka Tsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 57 days.

(21) Appl. No.: 10/058,792

(22) Filed: Jan. 30, 2002

(65) Prior Publication Data

US 2002/0170022 A1 Nov. 14, 2002

(30) Foreign Application Priority Data

Apr. 25, 2001 (JP) ........................ 2001-127534
Nov. 2, 2001 (JP) ........................ 2001-338185

(51) Int. Cl.[7] .................... G06F 15/00; G06F 17/18
(52) U.S. Cl. .................. 702/179; 702/180; 702/183
(58) Field of Search ................ 702/179, 180, 702/182–183, 186, 122; 706/12, 14, 20, 25, 49, 62

(56) References Cited

U.S. PATENT DOCUMENTS 5,794,209 A * 8/1998 Agrawal et al. ............. 705/10
6,154,739 A * 11/2000 Wrobel ......................... 707/6
2001/0020284 A1   9/2001 Hidetake et al.

FOREIGN PATENT DOCUMENTS

JP     2001-306999     11/2001

OTHER PUBLICATIONS

"AnalysisForce / YA"/Fujitsu LSI Technology Limited, Jan. 11, 2000.
Internet web site http://www.spss.com/clementine, 2 pages, 2001.
Internet web site http:/www.sas.com/products/miner/index.html, 2 pages, 2001.
Internet web site http://www.ydyn.com/yieldmgmt.htm, 3 pages, 1997–2001.

* cited by examiner

*Primary Examiner*—Bryan Bui
(74) *Attorney, Agent, or Firm*—Arent Fox Kintner Plotkin & Kahn, PLLC

(57) ABSTRACT

Data to be analyzed, for example, a yield value and various measurement values are selected and extracted from an original data group (step S1). At least one data distribution characteristic is extracted with respect to the extracted data (step S2). The data distribution characteristic amount to be analyzed is selected from these characteristics, and data mining such as a regression tree analysis is performed, designating it as a target variable (step S3). After the regression tree analysis has been completed with respect to all the extracted data distribution characteristics (step S4), the analysis result is output, and the engineer confirms it (step S5), and makes a decision (step S6).

31 Claims, 42 Drawing Sheets

FIG.3  Conventional Art
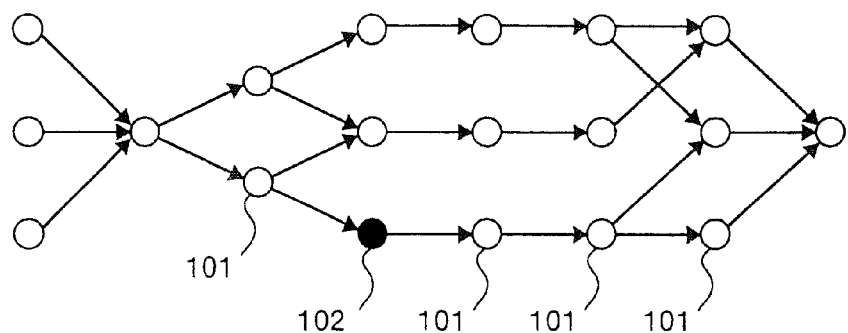
FIG.4
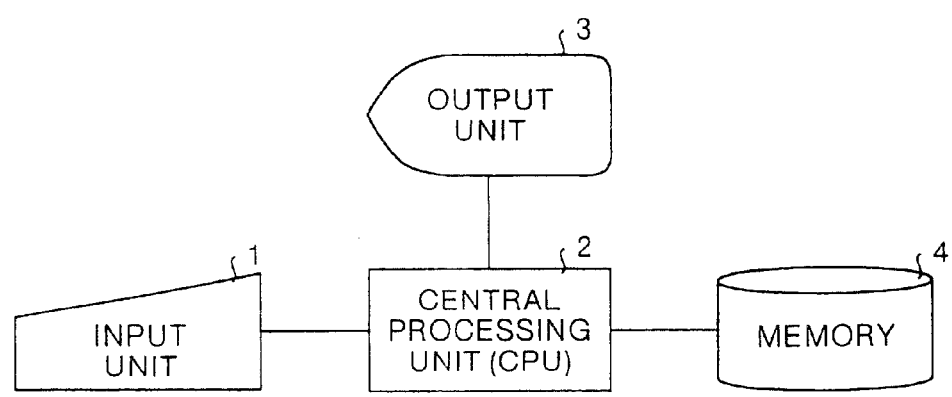

FIG.6

EACH CHARACTERISTIC AMOUNT

| RECORD id | CHARAC-TERISTIC 1 | CHARAC-TERISTIC 2 | CHARAC-TERISTIC 3 | ... | ... | CHARAC-TERISTIC i | ... |
|---|---|---|---|---|---|---|---|
| RECORD 1 | | | | | | | |
| | | | | | | | |
| RECORD i | | | | | | | |
| | | | | | | | |
| | | | | | | | |
| | | | | | | | |
| ... | ... | ... | ... | ... | ... | ... | ... |
| RECORD j | | | | | | | |
| | | | | | | | |
| | | | | | | | |
| | | | | | | | |
| RECORD n | | | | | | | |

※ EACH VALUE OF THE CHARACTERISTIC AMOUNT IS DEFINED BY A CONTINUOUS VALUE INDICATING THE STRENGTH.

FIG.7

| CHARACTERISTIC ITEMS | EACH CHARACTERISTIC AMOUNT | CHARACTERISTIC ITEM NAME |
|---|---|---|
| AVERAGE OF THE WHOLE DATA DISTRIBUTION | (1) MEAN VALUE | ave |
| DIFFERENCE IN DATA | (2) STANDARD DEVIATION | s |
| CORRELATION OF DATA WITH RESPECT TO WAFER NUMBER | (3) CORRELATION COEFFICIENT | r |
| y-AXIS SECTION AT LINEAR APPROXIMATION | (4) y-AXIS SECTION IN LINEAR APPROXIMATION EXPRESSION | a |
| INCLINATION OF DATA WITH RESPECT TO WAFER NUMBER | (5) POPULATION REGRESSION COEFFICIENT | b |
| STRENGTH OF CYCLE 2 (PIECES) | (6) DISPERSION RATIO (RATIO TO DISPERSION WHICH DOES NOT CONSIDER CYCLE) | 2 |
| STRENGTH OF CYCLE 3 (PIECES) | (7) DISPERSION RATIO (RATIO TO DISPERSION WHICH DOES NOT CONSIDER CYCLE) | 3 |
| STRONGEST CYCLE IN LOT | (8) CYCLE HAVING THE LARGEST DISPERSION RATIO | λ |
| DIFFERENCE IN MEAN VALUE BETWEEN THE FIRST HALF WAFER AND THE SECOND HALF WAFER | (9) DIFFERENCE IN MEAN VALUE BETWEEN THOSE TWO | ave_d |
| DIFFERENCE IN DISPERSION BETWEEN THE FIRST HALF WAFER AND THE SECOND HALF WAFER | (10) DIFFERENCE IN STANDARD DEVIATION BETWEEN THOSE TWO | s_d |
| DIFFERENCE IN CORRELATION BETWEEN THE FIRST HALF WAFER AND THE SECOND HALF WAFER | (11) DIFFERENCE IN CORRELATION COEFFICIENT BETWEEN THOSE TWO | r_d |
| DIFFERENCE IN y-AXIS SECTION IN LINEAR APPROXIMATION BETWEEN THE FIRST HALF WAFER AND THE SECOND HALF WAFER | (12) DIFFERENCE IN y-AXIS SECTION IN LINEAR APPROXIMATION BETWEEN THOSE TWO | a_d |
| DIFFERENCE IN INCLINATION BETWEEN THE FIRST HALF WAFER AND THE SECOND HALF WAFER | (13) DIFFERENCE IN POPULATION REGRESSION COEFFICIENT BETWEEN THOSE TWO | b_d |
| STRENGTH OF CYCLE 2 (PIECES) OF THE SECOND HALF LOT | (14) DISPERSION RATIO (RATIO TO DISPERSION WHICH DOES NOT CONSIDER CYCLE) | 2_r |
| STRENGTH OF CYCLE 3 (PIECES) OF THE SECOND HALF LOT | (15) CYCLE HAVING THE LARGEST DISPERSION RATIO | 3_r |
| STRONGEST CYCLE OF THE SECOND HALF LOT | (16) CYCLE HAVING THE LARGEST DISPERSION RATIO | λ_r |

FIG.14

DM-Evaluation

{Evaluation Data} TOTAL: ave=0.73849, s=0.055853, N=31

01:S RATIO=0.4372, t=2.040,(DIFFERENCE 0.043601,N9,22),attr=SECOND WIRING_APPARATUS,group
={NO. 11 MACHINE|NO. 13 MACHINE<NO. 12 MACHINE|NO. 14 MACHINE|NO. 17 MACHINE|NO. 18 MACHINE}

02:S RATIO=0.4399, t=1.990,(DIFFERENCE 0.039231,N18,13),attr=2CON STEP_APPARATUS, group
={NO. 11 MACHINE<NO. 12 MACHINE|NO. 13 MACHINE}

03:S RATIO=0.4524, t=1.747,(DIFFERENCE 0.035392,N19,22),attr=Field_Ox ,group={PM1|PM2<PM3}

04:S RATIO=0.4732, t=1.282,(DIFFERENCE 2.58930000000001 E-02,N16,15),attr=THIRD WIRING_APPARATUS, group
={NO. 13 MACHINE>NO. 14 MACHINE}

05:S RATIO=0.4768, t=1.189,(DIFFERENCE 0.027524,N23,8),attr=F DIFFUSION STEP_APPARATUS, group={F5|F6|F7|F8>F9}

06:S RATIO=0.4796, t=1.112,(DIFFERENCE 0.045972,N29,2),attr=FIRST WIRING_APPARATUS, group
={NO. 12 MACHINE|NO. 16 MACHINE|NO. 19 MACHINE>NO. 14 MACHINE}

07:S RATIO=0.4804, t=1.088,(DIFFERENCE 0.022136,N16,15),attr=DRY STEP_APPARATUS, group
={DRY-1|DRY-2|DRY-3>DRY-6|DRY-7|DRY-8}

08:S RATIO=0.4808, t=1.077,(DIFFERENCE 2.220499999999 E-02,N13,18),attr
=FIRST INTERLAMINAR STEP_APPARATUS, group={NO. 10 MACHINE>NO. 11 MACHINE|NO. 19 MACHINE}

09:S RATIO=0.4945, t=.567,(DIFFERENCE 0.011758,N17,14),attr=FIRST WASHING STEP_APPARATUS, group={#71|#77<#76}

10:S RATIO=0.4949, t=.547,(DIFFERENCE 0.0113,N15,16),attr=DRY-1 CONDITION, group={CONDITION A>CONDITION B}

11:S RATIO=0.4962, t=.469,(DIFFERENCE 2.74180000000001E-02,N1,30),attr
=SECOND OXIDATION STEP_APPARATUS, group={#21>#24}

12:S RATIO=0.4991, t=.225,(DIFFERENCE 6.345000000005E-03,N26,5),attr=1CON STEP_APPARATUS, group
={NO. 11 MACHINE>NO. 12 MACHINE}

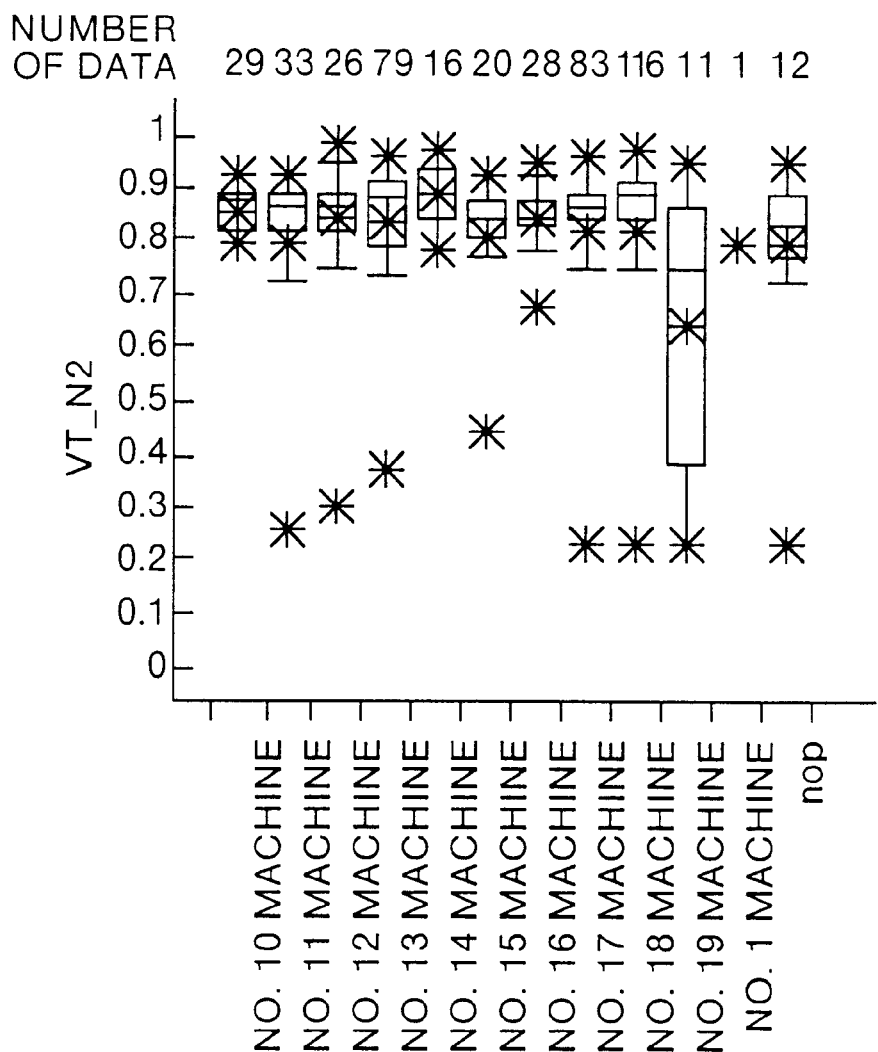

FIG.17

DM-Evaluation

[Evaluation Data]TOTAL:ave=0.73942,s=0.131042, N=454

01:S RATIO=0.4890, t=3.192,(DIFFERENCE 3.9165999999999E-02,N253,201),attr=2CON STEP_APPARATUS, group={NO. 11 MACHINE<NO. 12 MACHINE|NO. 13 MACHINE}

02:S RATIO=0.4920, t=2.714,(DIFFERENCE 3.60720000000001E-02,N138,316),attr=SECOND WIRING_APPARATUS, group={NO. 11 MACHINE|NO. 13 MACHINE<NO. 12 MACHINE|NO. 14 MACHINE|NO. 17 MACHINE|NO. 18 MACHINE}

03:S RATIO=0.4932, t=2.496,(DIFFERENCE 0.030574,N234,220),attr=THIRD WIRING_APPARATUS, group={NO. 13 MACHINE>NO. 14 MACHINE}

04:S RATIO=0.4938, t=2.390,(DIFFERENCE 2.94420000000001E-02,N203,251),attr=Field_Ox,group={PM1<PM2|PM3}

05:S RATIO=0.4947, t=2.201,(DIFFERENCE 5.60860000000001E-02,N426,28),attr=DRY STEP_APPARATUS, group={DRY-1|DRY-2|DRY-3|DRY-7|DRY-8>DRY-6}

06:S RATIO=0.4951, t=2.117,(DIFFERENCE 0.029771,N338,116),attr=F DIFFUSION STEP_APPARATUS, group={F5|F6|F7|F8>F9}

07:S RATIO=0.4966, t=1.756,(DIFFERENCE 4.41100000000001E-02,N425,29),attr=FIRST WIRING_APPARATUS, group={NO. 12 MACHINE|NO. 13 MACHINE|NO. 16 MACHINE|NO. 19 MACHINE>NO. 14 MACHINE}

08:S RATIO=0.4974, t=1.530,(DIFFERENCE 1.8980999999999E-02,N197,257),attr=FIRST INTERLAMINAR STEP_APPARATUS, group={NO. 10 MACHINE>NO. 11 MACHINE|NO. 19 MACHINE}

09:S RATIO=0.4981, t=1.316,(DIFFERENCE 0.016187,N227,227),attr=DRY-1 CONDITION, group={CONDITION A>CONDITION B}

10:S RATIO=0.4992, t=.850,(DIFFERENCE 1.05080000000001E-02,N245,209),attr=FIRST WASHING STEP_APPARATUS, group={#71|#77|<#76}

11:S RATIO=0.4992, t=.845,(DIFFERENCE 2.66620000000001E-02,N18,436),attr=SECOND OXIDATION STEP_APPARATUS, group={#21>#24}

12:S RATIO=0.4996, t=.591,(DIFFERENCE 9.97199999998E-03,N382,72),attr=1CON STEP_APPARATUS, group={NO. 11 MACHINE>NO. 12 MACHINE}

FIG.19

| LOTNO | N | VT_N2_ave | VT_N2_s | VT_N2_r | | | VT_N2_2 | VT_N2_3 |
|---|---|---|---|---|---|---|---|---|
| Lot-000000001-01 | 16 | 0.69815 | 0.1478931 | 4.47E-02 | | | 1.274965 | 1.321222 |
| Lot-000000001-02 | 14 | 0.6188715 | 0.1463331 | -0.139131 | | | 0.9296408 | 1.217859 |
| Lot-000000002-01 | 11 | 0.5766091 | 0.1710969 | 0.3196502 | | | 0.9166966 | 1.008273 |
| Lot-000000002-02 | 19 | 0.742879 | 0.1093633 | 0.2974553 | | | 1.103345 | 1.117199 |
| Lot-000000003-01 | 15 | 0.6880867 | 0.1246569 | -0.1720236 | | | 1.025705 | 1.100679 |
| Lot-000000014-01 | 13 | 0.8034308 | 3.90E-02 | 0.1739803 | | | 1.163205 | 1.299204 |
| Lot-000000014-02 | 16 | 0.7014812 | 0.158805 | 0.2434947 | | | 1.095047 | 0.9745571 |
| Lot-000000015-01 | 12 | 0.7383083 | 0.1143002 | -0.2931326 | | | 0.9460127 | 0.9846615 |
| Lot-000000015-02 | 18 | 0.7650278 | 0.0660148 | 0.1770862 | | | 1.231055 | 0.8761193 |

FIG.21

| RECORD id | USED APPARATUS NAME | | | ... | STEP i | CHARACTERISTIC AMOUNT | | | | |
|---|---|---|---|---|---|---|---|---|---|---|
| | STEP 1 | STEP 2 | STEP 3 | ... | | VT_N2_ave | VT_N2_s | VT_N2_r | VT_N2_2 | VT_N2_3 |
| lot 1 | M11 | M21 | M32 | ... | Mi1 | 0.69815 | 0.147 | 0.0447 | 1.2749 | 1.321 |
| lot l | M12 | M22 | M32 | ... | Mi2 | 0.6188 | 0.14633 | -0.1391 | 0.9296 | 1.2178 |
| ... | | | | ... | | | | | | |
| lot j | M12 | M22 | M31 | ... | Mi2 | 0.5766 | 0.1710 | 0.3196 | 0.9166 | 1.0082 |
| lot n | M11 | M23 | M32 | ... | Mi1 | 0.7650 | 0.0660 | 0.17708 | 1.2310 | 0.8761 |

FIG.22

| RECORD id | STEP 1 | STEP 2 | STEP 3 | | | STEP i | YIELD |
|---|---|---|---|---|---|---|---|
| lot 1 | M11 | M21 | M32 | | | Mi1 | 0.69 |
| | | | | | | | |
| lot l | M12 | M22 | M32 | | | Mi2 | 0.88 |
| | | | | | | | |
| | | | | | | | |
| | | | | | | | |
| lot j | M12 | M22 | M31 | | | Mi2 | 0.65 |
| | | | | | | | |
| | | | | | | | |
| | | | | | | | |
| lot n | M11 | M23 | M32 | | | Mi1 | 0.85 |

FIG.24

DM-Evaluation

{Evaluation Data} TOTAL:ave=0.10759,s=0.057913, N=31

01:S RATIO=0.3767, t=3.081,(DIFFERENCE 0.078187,N26,5),attr=Field_Ox,group={PM1|PM3<PM2}

02:S RATIO=0.4303, t=2.167,(DIFFERENCE 0.047623,N9,22),attr=SECOND WIRING_APPARATUS, group={NO. 11 MACHINE|NO. 17 MACHINE>NO. 12 MACHINE|NO. 13 MACHINE|NO. 14 MACHINE|NO. 18 MACHINE}

03:S RATIO=0.4391, t=2.005,(DIFFERENCE 0.060287,N27,4),attr=DRY STEP_APPARATUS, group={|DRY-1|DRY-3|DRY-7|DRY-8<DRY-2|DRY-6}

04:S RATIO=0.4580, t=1.632,(DIFFERENCE 0.033746,N17,14),attr=FIRST WIRING_APPARATUS, group={#71|#77<#76}

05:S RATIO=0.4733, t=1.280,(DIFFERENCE 0.027139,N18,13),attr=2CON STEP_APPARATUS, group={NO. 11 MACHINE>NO. 12 MACHINE|NO. 13 MACHINE}

06:S RATIO=0.4816, t=1.054,(DIFFERENCE 0.022256,N16,15),attr=THIRD WIRING_APPARATUS, group={NO. 13MACHINE<NO. 14 MACHINE}

07:S RATIO=0.4839, t=.984,(DIFFERENCE 0.04237,N2,29),attr=F DIFFUSION STEP_APPARATUS, group={F5|F6<F7|F8|F9}

08:S RATIO=0.4887, t=.819,(DIFFERENCE 0.035462,N29,2),attr=FIRST WIRING_APPARATUS, group={NO. 12 MACHINE|NO. 14 MACHINE>NO. 13 MACHINE|NO. 16 MACHINE}

09:S RATIO=0.4914, t=.712,(DIFFERENCE 0.042962,N1,30),attr=SECOND OXIDATION STEP_APPARATUS, group={#21<#24}

10:S RATIO=0.4957, t=.501,(DIFFERENCE 0.010877,N13,18),attr=FIRST INTERLAMINAR STEP_APPARATUS, group={NO. 10 MACHINE>NO. 11 MACHINE|NO. 19 MACHINE}

11:S RATIO=0.4982, t=.325,(DIFFERENCE 9.4799999999999E-03,N26,5),attr=1CON STEP_APPARATUS, group={NO. 11 MACHINE>NO. 12 MACHINE}

12:S RATIO=0.4998, t=.110,(DIFFERENCE 2.36500000000001E-03,N15,16),attr=DRY-1 CONDITION, group={CONDITION A>CONDITION B}

FIG.35

```
DM-Evaluation                                                                                               [_][□][X]

[Evaluation Data]TOTAL:ave=1.15723,s=0.387632, N=31

01:S RATIO=0.4139, t=2.456,(DIFFERENCE 0.544003,N28,3),attr=F DIFFUSION STEP_APPARATUS, group={F5|F6|F8|F9<F7}

02:S RATIO=0.4550, t=1.693,(DIFFERENCE 0.233557,N17,14),attr=FIRST WASHING STEP_APPARATUS,
group={#71|#77<#76}

03:S RATIO=0.4592, t=1.605,(DIFFERENCE 0.23135,N20,11),attr=SECOND WIRING_APPARATUS,
group={NO. 11 MACHINE|NO. 12 MACHINE|NO. 13 MACHINE|NO. 14 MACHINE|NO. 17 MACHINE<NO. 18 MACHINE}

04:S RATIO=0.4674, t=1.423,(DIFFERENCE 0.198151,N16.15),attr=THIRD WIRING_APPARATUS,
group={NO. 13 MACHINE<NO. 14 MACHINE}

05:S RATIO=0.4713, t=1.330,(DIFFERENCE 0.188287,N13,18),attr=FIRST INTERLAMINAR STEP_APPARATUS,
group=={NO. 10 MACHINE>NO. 11 MACHINE|NO. 19 MACHINE}

06:S RATIO=0.4783, t=1.147,(DIFFERENCE 0.162229,N14,17),attr=DRY STEP_APPARATUS,
group={DRY-1|DRY-7|DRY-8<DRY-2|DRY-3|DRY-6}

07:S RATIO=0.4785, t=1.142,(DIFFERENCE 0.272064,N28,3),attr=FIRST WIRING_APPARATUS,
group={NO. 12 MACHINE|NO. 16 MACHINE>NO. 13 MACHINE|NO. 14 MACHINE}

08:S RATIO=0.4824, t=1.029,(DIFFERENCE 0.149335,N19,12),attr=Field_Ox,group={PM1|PM2<PM3}

09:S RATIO=0.4854, t=.934,(DIFFERENCE 0.136026,N19,12),attr=2CON STEP_APPARATUS,
group={NO. 11 MACHINE|NO. 13 MACHINE<NO. 12 MACHINE}

10:S RATIO=0.4947, t=.556,(DIFFERENCE 0.108163,N26,5),attr=1CON STEP_APPARATUS,
group={NO. 11 MACHINE>NO. 12 MACHINE}

11:S RATIO=0.4989, t=.250,(DIFFERENCE 0.036035,N15,16),attr=DRY-1 CONDITION, group={CONDITION A>CONDITION B}

12:S RATIO=0.4994, t=.187,(DIFFERENCE 0.076284,N1,30),attr=SECOND OXIDATION STEP_APPARATUS, group={#21>#24}
```

| wafer No | STA | STB | STC | | VTH | RSP | WET_1 | Yield |
|---|---|---|---|---|---|---|---|---|
| wafer 1 | AM1 | BM3 | CM1 | | 0.51 | 86.8 | val_11 | 0.805 |
| wafer 2 | AM2 | BM1 | CM2 | | 0.63 | 95.6 | val_12 | 0.715 |
| wafer 3 | AM2 | BM3 | CM2 | | 0.75 | 97.6 | val_13 | 0.857 |
| | | | | | | | | |
| | | | | | | | | |
| wafer i | AMi | BMi | CMi | | 0.32 | 80.1 | val_1i | 0.658 |
| wafer j | AMj | BMj | CMj | | 0.94 | 95.6 | val_1j | 0.715 |
| | | | | | | | | |
| | | | | | | | | |
| | AM2 | BM3 | CM1 | | 0.98 | 80.2 | val_1 | 0.825 |
| wafer n | AM1 | BM1 | CM1 | | 0.81 | 98.0 | val_1n | 0.605 |

411 → STA, STB, STC (part of 401)
412 → VTH, RSP, WET_1 (part of 401)
413 → Yield (402)

FIG.45

| RANKING | TOTAL AVE=75, s=12, N=1000 | | | | |
|---|---|---|---|---|---|
| 601 — 1 | S RATIO =0.3211 | t=16.562 | (DIFFERENCE =26,N=400,500) | attr=STA | group=AM1<AM2 |
| 602 — 2 | S RATIO =0.3954 | t=10.881 | (DIFFERENCE =16,N=300,700) | attr=STD | group=DM1<DM2 |
| 603 — 3 | S RATIO =0.4495 | t=9.812 | (DIFFERENCE =6,N=550,450) | attr=STE | group=EM1<EM2 |
| 604 — 4 | S RATIO =0.4581 | t=8.864 | (DIFFERENCE =35,N=100,900) | attr=STX | group=XM1<XM2 |
| ⋮ | | | | | |

FIG.46

| STEP AND ELECTRICAL CHARACTERISTIC DATA OF WAFER | | | | AVERAGE YIELD | NUMBER OF WAFER |
|---|---|---|---|---|---|
| STA | STB | STC | RSP | | |
| AM1 | BM1 | Don't Care | Don't Care | 45% | 80 |
|  | BM3 |  |  | 60% | 120 |
| AM2 | Don't Care | CM1 | Don't Care | 50% | 200 |
|  |  | CM2 | RSP>90 | 80% | 200 |
|  |  |  | RSP≦90 | 95% | 400 |

FIG. 47

| | WAFERNO | COMPARISON EXPLANATORY VARIABLE ST1 | COMPARISON EXPLANATORY VARIABLE ST2 | REFERENCE EXPLANATORY VARIABLE ST3 | COMPARISON EXPLANATORY VARIABLE WET2 | WY |
|---|---|---|---|---|---|---|
| HIGH YIELD GROUP OF REFERENCE EXPLANATORY VARIABLES | MB9114 | H=S1M1\|S1M3\|S1M4 | H=S2M1\|S2M3 | H=S3M5\|S3M6\|S3M7\|S3M8 | H=(WET2=<12.0) | 73.8 |
| | MB9026 | H=S1M1\|S1M3\|S1M4 | H=S2M1\|S2M3 | H=S3M5\|S3M6\|S3M7\|S3M8 | H=(WET2=<12.0) | 73.1 |
| | MB8835 | H=S1M1\|S1M3\|S1M4 | H=S2M1\|S2M3 | H=S3M5\|S3M6\|S3M7\|S3M8 | H=(WET2=<12.0) | 76 |
| | MB8826 | H=S1M1\|S1M3\|S1M4 | H=S2M1\|S2M3 | H=S3M5\|S3M6\|S3M7\|S3M8 | H=(WET2=<12.0) | 78.5 |
| | MB8801 | H=S1M1\|S1M3\|S1M4 | L=S2M2 | H=S3M5\|S3M6\|S3M7\|S3M8 | H=(WET2=<12.0) | 73.4 |
| | MB8726 | H=S1M1\|S1M3\|S1M4 | H=S2M1\|S2M3 | H=S3M5\|S3M6\|S3M7\|S3M8 | L=(WET2>12.0) | 78.2 |
| | MB8701 | H=S1M1\|S1M3\|S1M4 | H=S2M1\|S2M3 | H=S3M5\|S3M6\|S3M7\|S3M8 | L=(WET2>12.0) | 78.1 |
| | MB8514 | H=S1M1\|S1M3\|S1M4 | H=S2M1\|S2M3 | H=S3M5\|S3M6\|S3M7\|S3M8 | L=(WET2>12.0) | 75.6 |
| | MB8511 | H=S1M1\|S1M3\|S1M4 | H=S2M1\|S2M3 | H=S3M5\|S3M6\|S3M7\|S3M8 | L=(WET2>12.0) | 77.7 |
| | MB8501 | H=S1M1\|S1M3\|S1M4 | H=S2M1\|S2M3 | H=S3M5\|S3M6\|S3M7\|S3M8 | L=(WET2>12.0) | 80.3 |
| LOW YIELD GROUP OF REFERENCE EXPLANATORY VARIABLES | MB0026 | L=S1M2 | L=S2M2 | L=S3M2\|S3M3\|S3M9 | L=(WET2>12.0) | 56.9 |
| | MB9526 | L=S1M2 | L=S2M2 | L=S3M2\|S3M3\|S3M9 | L=(WET2>12.0) | 34.6 |
| | MB2901 | H=S1M1\|S1M3\|S1M4 | L=S2M2 | L=S3M2\|S3M3\|S3M9 | L=(WET2>12.0) | 75.9 |
| | MB1901 | H=S1M1\|S1M3\|S1M4 | H=S2M1\|S2M3 | L=S3M2\|S3M3\|S3M9 | L=(WET2>12.0) | 80.6 |
| | MB1326 | H=S1M1\|S1M3\|S1M4 | H=S2M1\|S2M3 | L=S3M2\|S3M3\|S3M9 | L=(WET2>12.0) | 75.1 |
| | MB1139 | H=S1M1\|S1M3\|S1M4 | L=S2M2 | L=S3M2\|S3M3\|S3M9 | H=(WET2=<12.0) | 73.5 |
| | MB1111 | H=S1M1\|S1M3\|S1M4 | L=S2M2 | L=S3M2\|S3M3\|S3M9 | H=(WET2=<12.0) | 75.4 |
| | MB1101 | H=S1M1\|S1M3\|S1M4 | L=S2M2 | L=S3M2\|S3M3\|S3M9 | H=(WET2=<12.0) | 72.9 |
| | MB1926 | H=S1M1\|S1M3\|S1M4 | H=S2M1\|S2M3 | L=S3M2\|S3M3\|S3M9 | H=(WET2=<12.0) | 77.5 |
| | MB1022 | H=S1M1\|S1M3\|S1M4 | L=S2M2 | L=S3M2\|S3M3\|S3M9 | H=(WET2=<12.0) | 75 |
| CALCULATING FORMULA | | 2*12/20-1 | 2*15/20-1 | 2*20/20-1 | 2*10/20-1 | |
| BISECTED CONFOUNDING DEGREE | | 0.20 | 0.50 | 1.00 | 0.00 | |
| BISECTED INDEPENDENCE DEGREE | | 0.80 | 0.50 | 0.00 | 1.00 | |

FIG.49

| | TOTAL Ave=75,s=12,N=1427 |
|---|---|
| 1001 | 01:S RATIO=0.4217, t=16.272,(DIFFERENCE=22,N=1388,39),attr=ST1,group={S1M1|S1M3|S1M4>S1M2} |
| 1002 | 02:S RATIO=0.4619, t=10.835,(DIFFERENCE=7,N=1249,178),attr=ST2,group={S2M1|S2M3>S2M2} |
| 1003 | 03:S RATIO=0.4642, t=10.487,(DIFFERENCE=5,N=596,731),attr=ST3,group={S3M2|S3M3<S3M1|S3M4} |
| 1004 | 04:S RATIO=0.468, t=9.874,(DIFFERENCE=6,N=1397,30),attr=ST4,group={S4M2>S4M1} |
| 1005 | 05:S RATIO=0.4746, t=8.733,(DIFFERENCE=6,N=1274,153),attr=ST5,group={S5M1|S5M2|S5M4|S5M5>S5M3} |
| 1006 | 06:S RATIO=0.4749, t=8.681,(DIFFERENCE=6,N=1263,164),attr=ST6,group={S6M1|S6M2|S6M3>S1M6} |
| 1007 | 07:S RATIO=0.4758, t=8.510,(DIFFERENCE=4,N=482,945),attr=ST7,group={S7M3<S7M4|S7M5|S7M6} |
| 1008 | 08:S RATIO=0.4763, t=8.428,(DIFFERENCE=5,N=1102,325),attr=ST8,group={S8M2|S8M3|S8M4>S8M1} |
| 1009 | 09:S RATIO=0.4764, t=8.401,(DIFFERENCE=4,N=526,901),attr=WET1,group={(WET1>12.6)>(WET1≦12.6)} |
| 1010 | 10:S RATIO=0.4777, t=8.152,(DIFFERENCE=5,N=1214,213),attr=ST9,group={S9M1|S9M6|S9M8|S9M9>S9M5} |
| 1011 | 11:S RATIO=0.4786, t=7.980,(DIFFERENCE=10,N=1381,46),attr=ST10,group={S10M1|S10M2|S10M3>S10M5} |
| 1012 | 12:S RATIO=0.4797, t=7.822,(DIFFERENCE=8,N=75,1352),attr=WET2,group={(WET2>12.0)<(WET2≦12.0)} |
| | ... |

FIG.50

| ST1 | BISECTED CONFOUNDING DEGREE | BISECTED INDEPENDENCE DEGREE |
|---|---|---|
| ST2 | 0.771548704 | 0.228451296 |
| ST3 | 4.56E-02 | 0.954449895 |
| ST4 | 0.903293623 | 9.67E-02 |
| ST5 | 0.772950245 | 0.227049755 |
| ST6 | 0.791170287 | 0.208829713 |
| ST7 | 0.311843027 | 0.688156973 |
| ST8 | 0.531885074 | 0.468114926 |
| WET1 | 0.278206027 | 0.721793973 |
| ST9 | 0.688857744 | 0.311142256 |
| ST10 | 0.880868956 | 0.119131044 |
| WET2 | 0.857042747 | 0.142957253 |

FIG.51

| ST3 | BISECTED CONFOUNDING DEGREE | BISECTED INDEPENDENCE DEGREE |
|---|---|---|
| ST1 | 4.56E-02 | 0.951119895 |
| ST2 | 0.108619481 | 0.891380519 |
| ST4 | 4.70E-02 | 0.953048353 |
| ST5 | 6.24E-02 | 0.937631395 |
| ST6 | 7.71E-03 | 0.992291521 |
| ST7 | 4.98E-02 | 0.95024527 |
| ST8 | -2.10E-03 | 0.997897687 |
| WET1 | 0.103013315 | 0.896986685 |
| ST9 | 1.9E-02 | 0.988086896 |
| ST10 | 8.90E-02 | 0.911002102 |
| WET2 | 5.68E-02 | 0.943237561 |

FIG.52

| Attribute | ST1 | ST2 | ST3 | ST4 | ST5 | ST6 | ST7 | ST8 | WET1 | ST9 | ST10 | WET2 |
|---|---|---|---|---|---|---|---|---|---|---|---|---|
| ST1 | 1 | 0.77155 | 4.56E-2 | 0.90329 | 0.77295 | 0.79117 | 0.31184 | 0.53189 | 0.27821 | 0.68886 | 0.88087 | 0.85704 |
| ST2 | 0.77155 | 1 | 0.10862 | 0.79257 | 0.68465 | 0.66643 | 0.2712 | 0.58374 | 0.26279 | 0.58935 | 0.76053 | 0.69587 |
| ST3 | 4.56E-2 | 0.10862 | 1 | 4.70E-2 | 6020E-2 | 7.70E-3 | 4.90E-2 | -0.0021 | 0.103 | 1.20E-2 | 8.90E-2 | 5.60E-2 |
| ST4 | 0.90329 | 0.79257 | 4.70E-2 | 1 | 0.74352 | 0.7281 | 0.3665 | 0.56692 | 0.29923 | 0.65943 | 0.95795 | 0.87526 |
| ST5 | 0.77295 | 0.68485 | 6.24E-2 | 0.74352 | 1 | 0.77435 | 0.43238 | 0.5487 | 0.34828 | 0.70568 | 0.72109 | 0.70848 |
| ST6 | 0.79117 | 0.66643 | 7.71E-3 | 0.7281 | 0.77435 | 1 | 0.4506 | 0.53329 | 0.2768 | 0.82761 | 0.70568 | 0.73231 |
| ST7 | 0.31184 | 0.2712 | 4.98E-2 | 0.3665 | 0.43238 | 0.4506 | 1 | 0.46041 | 0.36931 | 0.53329 | 0.38893 | 0.31465 |
| ST8 | 0.53189 | 0.68374 | -0.0021 | 0.56692 | 0.5487 | 0.53329 | 0.46041 | 1 | 0.23896 | 0.55431 | 0.60897 | 0.50385 |
| WET1 | 0.27821 | 0.26279 | 0.10301 | 0.29923 | 0.34828 | 0.2768 | 0.36931 | 0.23896 | 1 | 0.25858 | 0.32165 | 0.24737 |
| ST9 | 0.68886 | 0.58935 | 1.19E-2 | 0.85943 | 0.70568 | 0.82761 | 0.53329 | 0.55431 | 0.25858 | 1 | 0.637 | 0.64681 |
| ST10 | 0.88087 | 0.75053 | 8.90E-2 | 0.95795 | 0.72109 | 0.70568 | 0.38893 | 0.60897 | 0.32165 | 0.637 | 1 | 0.85284 |
| WET2 | 0.85704 | 0.69587 | 5.68E-2 | 0.87526 | 0.70848 | 0.73231 | 0.31455 | 0.50385 | 0.24737 | 0.64881 | 0.85284 | 1 |
| Dep_ave | 0.62121 | 0.66157 | 5.27E-2 | 0.63089 | 0.5911 | 0.59037 | 0.35892 | 0.46627 | 0.27311 | 0.55572 | 0.62859 | 0.59004 |

| Attribute | ST1 | ST2 | ST3 | ST4 | ST5 | ST6 | ST7 | ST8 | WET1 | ST9 | ST10 | WET2 |
|---|---|---|---|---|---|---|---|---|---|---|---|---|
| ST1 | 0 | 0.22845 | 0.9544 | 0.09671 | 0.22705 | 0.20883 | 0.68816 | 0.46811 | 0.72179 | 0.31114 | 0.11913 | 0.14296 |
| ST2 | 0.22845 | 0 | 0.89138 | 0.20743 | 0.13535 | 0.33357 | 0.7288 | 0.41626 | 0.73721 | 0.41065 | 0.24947 | 0.30413 |
| ST3 | 9.54E-1 | 8.91E-1 | 0 | 9.53E-1 | 9.38E-1 | 9092E-1 | 9.51E-1 | 9.98E-1 | 8.97E-1 | 9.88E-1 | 9.11E-1 | 9.44E-1 |
| ST4 | 0.09671 | 0.20743 | 0.953 | 0 | 0.25648 | 0.2719 | 0.6335 | 0.43308 | 0.70077 | 0.34057 | 0.04205 | 0.12474 |
| ST5 | 0.22705 | 0.31535 | 0.9376 | 0.25648 | 0 | 0.22565 | 0.56762 | 0.4513 | 0.65172 | 0.29432 | 0.27891 | 0.29152 |
| ST6 | 0.20883 | 0.33357 | 0.99229 | 0.2719 | 0.22565 | 0 | 0.5797 | 0.46671 | 0.7232 | 0.17239 | 0.29432 | 0.26769 |
| ST7 | 0.68816 | 0.7288 | 0.9502 | 0.6335 | 0.56762 | 0.5494 | 0 | 0.53959 | 0.63069 | 0.46671 | 0.61107 | 0.68535 |
| ST8 | 0.46811 | 0.41626 | 0.9979 | 0.43308 | 0.4513 | 0.46671 | 0.53959 | 0 | 0.76104 | 0.44569 | 0.39103 | 0.49615 |
| WET1 | 0.72179 | 0.73721 | 0.89699 | 0.70077 | 0.66172 | 0.7232 | 0.63069 | 0.78104 | 0 | 0.74142 | 0.67836 | 0.75263 |
| ST9 | 0.31114 | 0.41065 | 0.9881 | 0.34057 | 0.29432 | 0.17239 | 0.46671 | 0.44589 | 0.74142 | 0 | 0.363 | 0.35319 |
| ST10 | 0.11913 | 0.24947 | 0.911 | 0.04205 | 0.27891 | 0.29432 | 0.61107 | 0.39103 | 0.67835 | 0.363 | 0 | 0.14716 |
| WET2 | 0.14296 | 0.30413 | 0.9432 | 0.12474 | 0.29152 | 0.26769 | 0.68535 | 0.49615 | 0.75263 | 0.35319 | 0.14716 | 0 |
| ind_ave | 0.37879 | 4.38E-1 | 0.94691 | 0.36911 | 0.4089 | 0.40963 | 0.64108 | 0.53335 | 0.72689 | 0.44428 | 0.37141 | 0.40996 |

1401

DATA ANALYSIS APPARATUS, DATA ANALYSIS METHOD, AND COMPUTER PRODUCTS

FIELD OF THE INVENTION

The present invention relates to a data analysis apparatus, a data analysis method, and computer products.

BACKGROUND OF THE INVENTION

A yield analysis of semiconductor data will be explained as an example. Particularly, as in the process data analysis, in the case where reference data for deciding measures for improving the quality and productivity from the analysis result is to be obtained, the accuracy and the reliability of the analysis are important. An application related to this has been already filed by the present inventor (Application No., Japanese Patent Application No. 2000-41896 and Japanese Patent Application No. 2000-284578). In order to find a cause of yield decrease and take measures as soon as possible, there is performed a data analysis for finding a factor affecting the yield, and another factor affecting this factor, from the apparatus history, test results, design information and various measurement data.

In data analysis, the one to be analyzed, such as yield, is referred to as a target variable, and the apparatus history, test results, design information and various measurement data which become factors of the target variable are referred to as explanatory variables. At that time, various statistical methods are applied. As one of these methods, by applying data mining, a value, information or regularity which is difficult to discriminate can be extracted from various mass data.

It is important to analyze the collected data multilaterally based on scientific grounds, and extracts more significant differences, in order to analyze defective factors of the semiconductor devices. Therefore, values of the original data stored in a computer system and the mean value thereof have heretofore been used often. However, there may be a case where it is difficult to extract defective factors from the complicated original data group. In this case, if there is a characteristic data distribution related to various measurement results and yield of chips in a wafer face and wafers in a lot, the defective data may be analyzed based on this.

In the conventional computer system, however, for example, original data related to the yield and electrical characteristic value is stored, but the characteristic data distribution across a plurality of chips in the wafer face and a plurality of wafers in the lot is hardly stored. Therefore, engineers need to obtain the data distribution, by editing the original data and using various statistical analysis tools and table creation tools. It is also necessary for them to sum up the data and recognize the tendency of the data, by checking up the obtained data distribution with the experience and know-how which the engineers have. Therefore, it is difficult to grasp objectively the characteristic amount related to the distribution of the mass original data. There is also a problem in that accurate results cannot be obtained, even if analysis is performed based on the characteristic amount of the data distribution including the subjective view of the engineer as described above.

Conventionally, engineers study the data distribution obtained by using various statistical analysis tools and table creation tools, to express the characteristic amount of the data distribution by a discrete value, in such a manner that, for example, if there is a certain feature or not in the distribution, if an increase or decrease tendency of a certain feature is "increasing" or "decreasing", if there is a periodicity of 2 or not in a certain feature, or of there is a periodicity of 3 or not in a certain feature. Therefore, the information representing the degree is lacking, for example, how much there is a certain feature (or no feature), or how much increasing tendency (or decreasing tendency) a certain feature has. There is also a problem in that in the case where a certain feature has a periodicity of 2 and a periodicity of 3 to some extent, only the periodicity having a larger degree can be recognized.

Considering various test results and measurement result, and combinations thereof, the combinations of the assumed data distribution characteristics become huge, and hence it is quite difficult to investigate all of these combinations. Further, the defective factors corresponding to the extracted data distribution characteristics are not always known, and lots of experiences and know-how are required in order to discriminate unknown defective factors.

For example, even if data mining is actually applied to yield analysis of the semiconductor data, there are some cases which don't work well. With the application in the fields of finance and distribution, since there is a huge number of data, i.e., several millions of data, and the number of explanatory variables is several tens at most, analysis results with high accuracy can be obtained. In the case of the semiconductor process data analysis, however, although the number of data is small, and in the same type, there are only about 200 lots at most, the number of explanatory variables reaches several hundreds (apparatus history, inspection between step, and the like). Hence, a plurality of explanatory variables is not independent any more, and hence reliable results may not be obtained only by performing data mining simply. The yield analysis of the semiconductor data will be explained briefly as an example.

In the process data analysis in which the number of explanatory variables (for example, LSI production step data) is large compared to the number of data (for example, the number of lots), there may be a case where a plurality of explanatory variables confounds with each other (becomes not independent), making it difficult to sufficiently narrow the problems due to the statistical significant difference. Even in the case where the data mining (regression tree analysis), if there is this problem, it is necessary to confirm the accuracy of the analysis results and the reliable range with time and effort.

FIG. 1 shows the relation between the lot flow and abnormal manufacturing apparatus. A outlined circle represents normal apparatus 101 and a black circle represents abnormal apparatus 102. An arrow shows the lot flow. Analysis of the inter-apparatus difference in the LSI production data extracts, from the data of the used apparatus for each step of each lot, as to which yield is most affected, on the condition of which production apparatus and production step are utilized.

FIG. 2 shows a yield distribution by apparatus (box and whisker chart) in a certain step using the conventional art. The yield value of the lot is displayed by the box and whisker chart for each apparatus used for each production step, so that confirmation is performed for each step, to thereby identify a step and apparatus having the most conspicuous difference.

With this method, however, a large number of records are required, since the number of steps becomes several hundreds at present, and in the case where the difference does not clearly appear, or the case where conditions are complicated, judgment is difficult. In order to deal with this, the data mining method by means of the regression tree analysis is effective, in which the used apparatus is divided into a group where the value of the target variable becomes high and a group where the value of the target variable becomes low. As shown in FIG. 3, in the case where the apparatus used for each lot is fixed and the lot is made to flow, there may be a case where the abnormal apparatus 102 represented by a black circle cannot be identified determinately. That is to say, in the case where the independency between explanatory variables is low, the one having a large significant difference due to bisection of set has not always an "actual large significant difference".

The above is confounding in the used apparatus in each step of the semiconductor manufacturing. The same thing applies to the confounding of bisected set as a result of regression tree analysis. That is to say, the same thing applies to the case where the set comprises a group of apparatus having high yield and a group of apparatus having high yield, in each step. The confounding of this bisected set is the same in the case where the explanatory variable is continuous.

SUMMARY OF THE INVENTION

It is an object of this invention to provide a data analysis method which extracts a data distribution characteristic amount such as various statistics by editing the original data, and objectively recognize and utilize this to thereby automatically extract defective factors or the like. It is another object of the present invention to provide a data analysis method and a data analysis apparatus which can clarify the confounding degree between a plurality of explanatory variables.

One aspect of the present invention is to automatically and quantitatively evaluate and extract various data distribution characteristics existing in the original data groups stored in a computer system, and select and analyze the amount of each extracted characteristic sequentially, to thereby automatically and quantitatively evaluate and extract the factor of each amount of characteristic. According to this aspect, since lots of information such as the tendency in the data distribution, characteristic patterns and the relation between data are extracted. Therefore, the relations and significant differences, which have been difficult to be discriminated due to being covered with various data, can be quantitatively extracted efficiently based on scientific grounds.

Accordingly, in order to clarify the confounding degree between a plurality of explanatory variables, there is provided a data analysis method comprising the steps of, preparing data result of an explanatory variable and a target variable, calculating the confounding degree and/or independence degree between a plurality of explanatory variables based on the data result, and performing data mining, using the confounding degree and/or independence degree. By calculating the confounding degree and/or independence degree between a plurality of explanatory variables, the confounding degree between the explanatory variables can be clearly caught. If the regression tree analysis is performed based on this, the confounding degree between the explanatory variables can be quantitatively evaluated, based on the result of set bisection in the regression tree analysis. As a result, it becomes possible to clarify a noteworthy explanatory variable confounding with an explanatory variable in which a significant difference at the first branch in the regression tree becomes a big problem.

Other objects and features of this invention will become understood from the following description with reference to the accompanying drawings.

BRIEF DESCRIPTION OF THE DRAWINGS

FIG. 3 is a diagram showing the confounding relation between the lot flow and abnormal manufacturing apparatus;

FIG. 4 is a diagram showing one example of a computer system used in a first embodiment of the present invention;

FIG. 6 is a diagram in which each characteristic amount extracted by extraction of data distribution characteristics is represented by a CSV type, in the first embodiment of the present invention;

FIG. 7 is a diagram showing information obtained by paying attention to a variation in attribute values of a wafer, as a characteristic of data distribution in lot, when yield analysis of semiconductor data is performed in the first embodiment of the present invention;

FIG. 14 is a diagram showing an example of a statistic list for evaluation with respect to the result of the regression tree analysis shown in FIG. 13;

FIG. 15 is a diagram showing a box and whisker chart in which all the VT_N2 data is displayed for each used apparatus of a second wiring_apparatus, as a specific example;

FIG. 17 is a diagram showing an example of a statistic list for evaluation with respect to the result of the regression tree analysis shown in FIG. 16;

FIG. 19 is a diagram showing a file which defines each characteristic amount of VT_N2 for each lot, as a specific example;

FIG. 21 is a diagram showing a file which performs the regression tree analysis with respect to the characteristic amount in the in-lot distribution of VT_N2, as a specific example;

FIG. 22 is a diagram showing an input file for analyzing the variation factor of yield with the regression tree analysis, as a specific example;

FIG. 24 is a diagram showing an example of a statistic list for evaluation with respect to the regression tree analysis shown in FIG. 23;

FIG. 35 is a diagram showing an example of a statistic list for evaluation with respect to the regression tree analysis shown in FIG. 34;

FIG. 45 is a diagram showing an example of the statistic list for evaluation;

FIG. 46 is a diagram showing the relation between used manufacturing apparatus, electrical characteristic data and yield;

FIG. 47 is a diagram showing a calculation example of bisected confounding degree and bisected independence degree;

FIG. 49 is a diagram showing an example of the statistic list for evaluation;

FIG. 50 is a diagram showing the confounding degree and independence degree between each explanatory variable and a first candidate;

FIG. 51 is a diagram showing the confounding degree and independence degree between each explanatory variable and a third candidate;

FIG. 52 is a diagram showing the confounding degree between all candidates and a mean value thereof;

FIG. 53 is a diagram showing the independence degree between all candidates and a mean value thereof;

DETAILED DESCRIPTIONS

The present invention relates to a data analysis method which grasps the relationship between data widely handled in the industrial circles and extracts a result having significance for leading to an industrially dominant effect. More particularly, this invention relates to the data analysis method which extracts knowledge and information, which is difficult to be discriminated by paying attention only to a data value to be analyzed or the average thereof. Further, this invention relates to the data analysis method and a data analysis apparatus which evaluate the accuracy of the analysis result.

For example, the present invention relates to the data analysis method used for grasping fluctuating situation of the yield based on the history of the used apparatus, the test result, the design information or various measurement data obtained in a semiconductor fabrication step, thereby extracting advantageous conditions for improving the yield. More particularly, this invention relates to the data analysis method and the data analysis apparatus which automatically and quantitatively extract and understand not only the original data and the average thereof stored in a computer system, but a data distribution characteristic obtained by editing the original data, and extract and evaluate the main cause of low yield of semiconductors or the like, based on the characteristic amount.

Further, the present invention relates to the data analysis method and data analysis apparatus, which deal with a case where a plurality of explanatory variables confounds with each other (becomes not independent) to thereby make it difficult to extract a significant difference, and evaluate the accuracy of the data analysis result for obtaining efficient and reliable analysis result.

A fist and second embodiments of the present invention will be explained in detail below with reference to the drawings.

FIG. 4 is a diagram showing one example of a hardware configuration of a computer system used for executing a data analysis method according to a first embodiment of the present invention. This computer system comprises, as shown in FIG. 4, an input unit 1, a central processing unit 2, an output unit and a memory 4.

Figure 1:
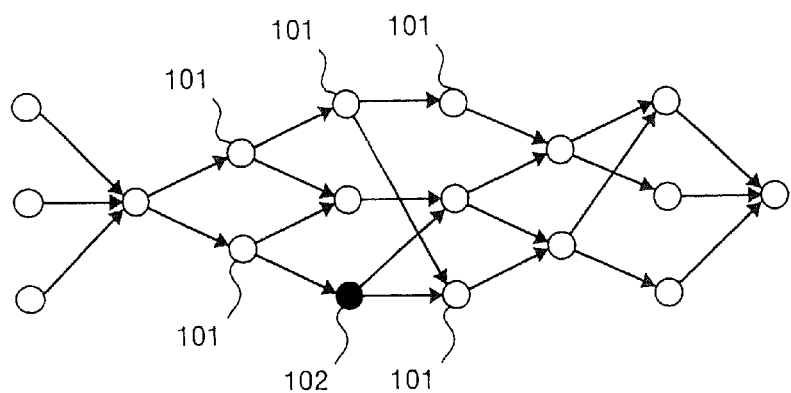
FIG. 1 is a diagram showing the relation between the lot flow and abnormal manufacturing apparatus.
Figure 2:
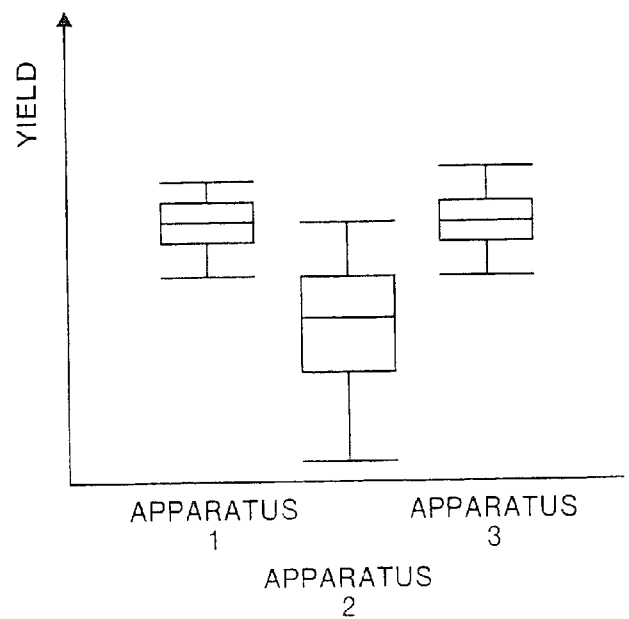
FIG. 2 is a diagram showing a yield distribution by apparatus in a step using the conventional art.
Figure 5:
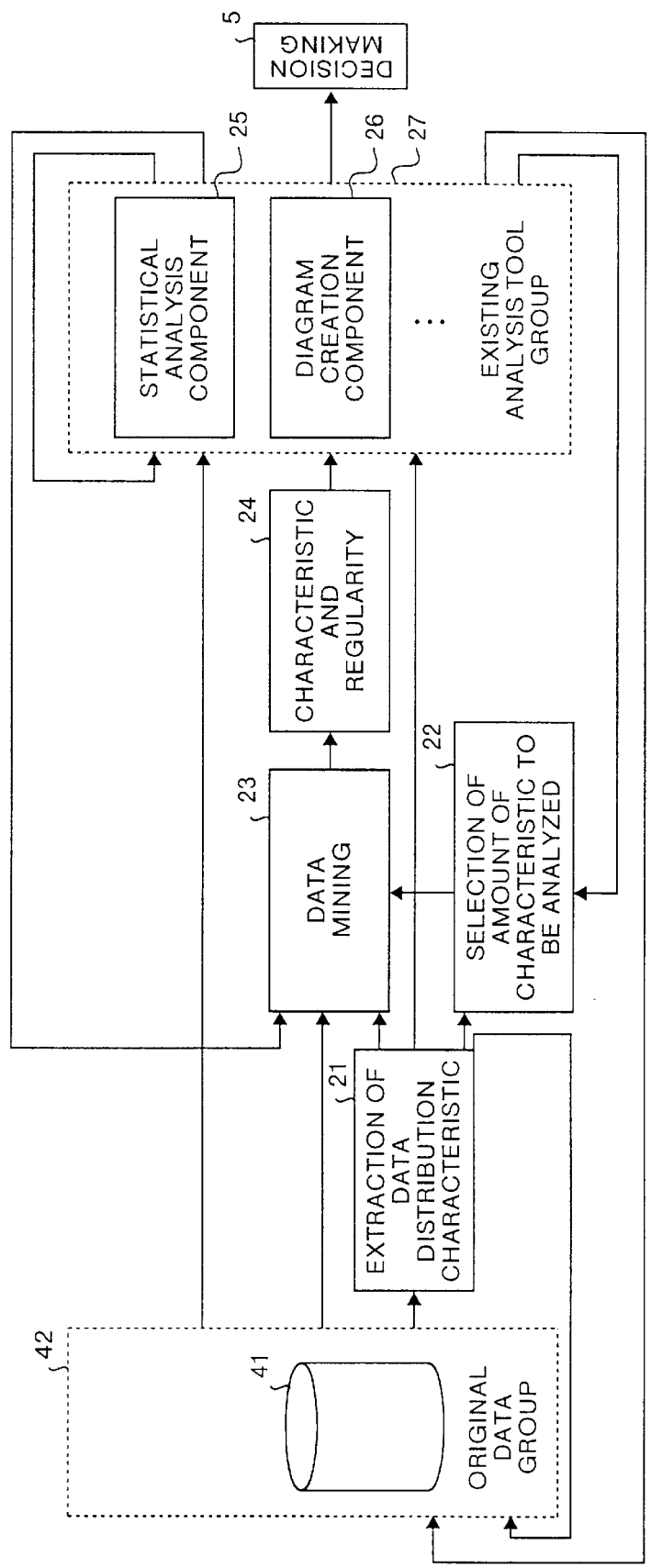
FIG. 5 is a block diagram showing one example of functional configuration of a data analysis apparatus, realized by the computer system having the configuration shown in FIG. 4.

FIG. 5 is a block diagram showing one example of the functional configuration of a data analysis apparatus, realized by the computer system having the configuration shown in FIG. 4. This data analysis apparatus has an original data group 42 comprising database 41 including a plurality of original data, as shown in FIG. 5. This database 41 is built in the memory 4 of the computer system shown in FIG. 4.

The data analysis apparatus comprises a unit 21 which quantitatively evaluates and extracts at least one data distribution characteristic existing in the original data group 42, a unit 22 which selects a characteristic amount to be analyzed, from the extracted at least one data distribution characteristic amount, a unit 23 which performs data mining by means of a regression tree analysis method or the like, by designating the data distribution characteristic amount selected as the object to be analyzed, as the target variable, to thereby extract a rule file 24 of characteristics and regularity latent in the data distribution, and an analysis tool group 27, such as a statistical analysis component 25 and a diagram creation component 26, which analyze the distribution characteristic of the original data, by using the extracted rule file 24.

The above each unit 21, 22 and 23 and the analysis tool group 27 are realized by executing a program for performing respective processing in the central processing unit 2. The extracted rule file 24 is stored in the memory 4, and output by the output unit 3, such as a display unit and a printer. Decision making 5 is performed based on the analysis result by means of the analysis tool group 27.

The above-described unit 23 which extracts the rule file 24 is to perform data mining with respect to the original data in the original data group 42, the data distribution characteristic extracted by the data distribution characteristic extraction unit 21, or the analysis result by means of the analysis tool group 27. The analysis tool group 27 is to perform an analysis with respect to the original data in the original data group 42, the data distribution characteristic extracted by the data distribution characteristic extraction unit 21, or the output result of the analysis tool group 27. The analysis result by means of the analysis tool group 27 is fed back to the unit 22 which selects a data distribution characteristic amount to be analyzed and the original data group 42. The output of the data distribution characteristic extraction unit 21 is also fed back to the original data group 42.

FIG. 6 is a diagram showing an example in which a data distribution characteristic amount extracted, for example, by the data distribution characteristic extraction unit 21 shown in FIG. 5 is output by a CSV type. Since each characteristic amount is obtained independently for each record, this is handled independently. For example, as shown in FIG. 6, since each characteristic amount is automatically output by the CSV type, a significant analysis can be performed efficiently for each characteristic amount. Here, the data showing the characteristic amount may be not only the original data value and a mean value thereof, but also a maximum value or a minimum value of the original data, range or a standard deviation value. The regularity of the data or a similarity to a specific model may be designated as the data showing the characteristic amount.

Various characteristics can be extracted by the structure of the data group to be extracted, but the processing related to which characteristic amount is to be extracted may be incorporated in the program, to suit the object, or a file defining the characteristic amount to be extracted may be prepared, and the file is read. Either characteristic amount is defined not by a discrete value, but by a continuous value showing how strong the characteristic is. Therefore, lack of information due to the discrete value as in the conventional case does not occur, and hence excellent analysis result can be expected.

As one example of the data distribution characteristic amount, an in-lot data distribution characteristic in the yield analysis of the semiconductor data will be explained. FIG. 7 is a table showing information obtained by paying attention to a variation in attribute values of wafers. Here, the independent variable is a wafer number, and the dependent variable is the original data, such as yield, category yield or various measurement values.

Though not particularly limited, in the example shown in FIG. 7, sixteen characteristic items are defined, that is, (1) average of the whole data distribution, (2) difference in data, (3) correlation of data with respect to wafer number, (4) y-axis section at linear approximation, (5) inclination of data with respect to wafer number, (6) strength of cycle 2 (pieces), (7) strength of cycle 3 (pieces), (8) strongest cycle in lot, (9) difference in the mean value between the first half wafer and the second half wafer, (10) difference in dispersion between the first half wafer and the second half wafer, (11) difference in correlation between the first half wafer and the second half wafer, (12) difference in y-axis section in linear approximation between the first half wafer and the second half wafer, (13) difference in inclination between the first half wafer and the second half wafer, (14) strength of cycle 2 (pieces) of the second half lot (wafers), (15) strength of cycle 3 (pieces) of the second half lot (wafers), and (16) strongest cycle of the second half lot (wafers). The characteristic amount of each characteristic item is obtained in a unit of lot.

Sixteen characteristic items defined here will be explained briefly. The characteristic amount of (1) is a mean value of yields and various measurement values of all wafers in the same lot. The characteristic amount of (2) is a standard deviation value such as yields and various measurement values of all wafers in the same lot. The characteristic amount of (3) is a correlation coefficient between the wafer number of wafers in the same lot and the yield and various measurement values, and the way of calculation of this correlation coefficient is determined beforehand according to the object of the analysis and the purpose thereof. The characteristic amount of (4) is a value of the y-axis section at the time of approximating the relation between x and y to a linear equation y=b·x+a, designating the wafer number of a wafer in the same lot as x, and yield and various measurement value as y.

The characteristic amount of (5) is a population regression coefficient at the time of approximating the relation between x and y to a linear equation y=b·x+a, designating the wafer number of a wafer in the same lot as x, and yield and various measurement value as y. The characteristic amount of (6) is a ratio of the dispersion of yields and various measurement value of all wafers in the same lot, to the dispersion of yields and various measurement values of wafer groups having the wafer number of 1, 3, 5, . . . , or wafer groups having the wafer number of 2, 4, 6, . . . The characteristic amount of (7) is a ratio of the dispersion of yields and various measurement value of all wafers in the same lot to the dispersion of yields and various measurement values of wafer groups having the wafer number of 1, 4, 7, . . . , wafer groups having the wafer number of 2, 5, 8, or wafer groups having the wafer number of 3, 6, 9 . . . The characteristic amount of (8) is a value of a cycle having the largest dispersion ratio, of the dispersion ratios of the cycle 2 (pieces) and the cycle 3 (pieces) obtained in the above-described (6) and (7), and dispersion ratios of a cycle 4 (pieces) and a cycle 5 (pieces). . . obtained in the similar manner, with respect to the wafers in the same lot.

The characteristic amount of (9) is a difference between a mean value of the yield and various measurement values of the first half wafer group, and a mean value of the yield and various measurement values of the second half wafer group, when all wafers in the same lot (for example 50 pieces) are divided into the first half (for example 25 pieces) and the second half (for example 25 pieces). The reason why the wafers are divided into the first half and the second half is that the apparatus history is different in the semiconductor manufacturing step. The characteristic amount of (10) is a difference between a standard deviation value, such as yield and various measurement values of the first half wafer group and a standard deviation value, such as yield and various measurement values of the second half wafer group. The characteristic amount of (11) is difference between a correlation coefficient of the first half wafer group and a correlation coefficient of the second half wafer group. The characteristic amount of (12) is a difference between a value of the y-axis section in linear approximation of the first half wafer group and a value of the y-axis section in linear approximation of the second half wafer group.

The characteristic amount of (13) is a difference between a population regression coefficient of the first half wafer group and a population regression coefficient of the second half wafer group. The characteristic amount of (14) is a dispersion ratio related to the cycle 2 similar to that of the above (6), with respect to the second half lot (wafers) group. The characteristic amount of (15) is a dispersion ratio related to the cycle 3 similar to that of the above (7), with respect to the second half lot (wafers) group. The characteristic amount of (16) is a value of a cycle having the largest dispersion ratio similar to that of the above (8) with respect to the second half lot (wafers) group. With respect to the first half lot (wafers) group, the strength of cycle 2 (pieces), the strength of cycle 3 (pieces) and the strongest cycle thereof may be defined as in the above (14) to (16). Not only the characteristic items exemplified herein, but also various characteristic items can be defined corresponding to the object to be analyzed and the purpose thereof.

Even in the case where a significant difference cannot be extracted by an apparatus to be used, only by the analysis using the original data value such as yield or the like and the mean value thereof, as in the conventional case, it may become possible to extract a significant difference by the apparatus to be used, by defining the above-described characteristic items and performing analysis. For example, FIG. 8 shows an example in which a difference (corresponding to (2) above) in the yield of wafers in lot is paid attention with regard to a plurality of lots.

Figure 8:
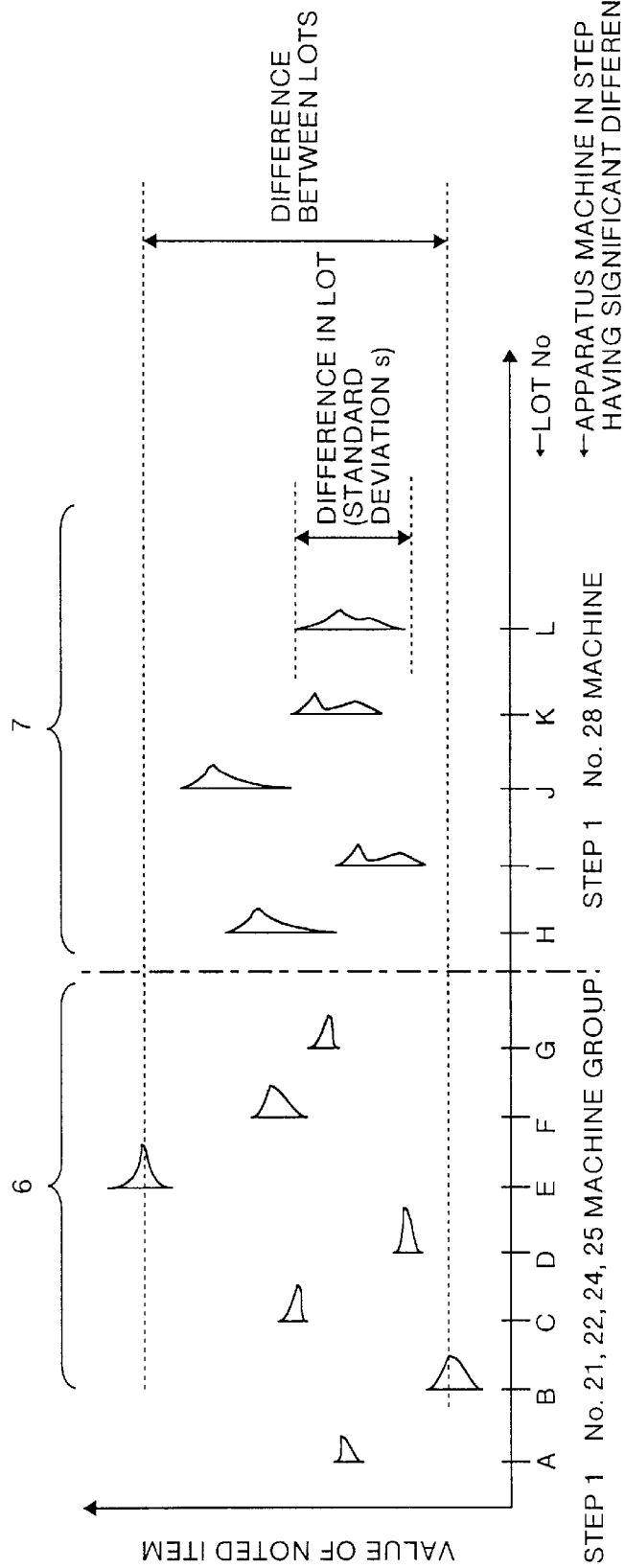
FIG. 8 is a diagram showing differences in the yield of wafers in lot with regard to a plurality of lots.

In the example shown in FIG. 8, the mean value of the wafer yield and the overall distribution (difference between lots) are substantially the same, between a lot group 6 in which No. 21 machine, No. 22 machine, No. 24 machine or No. 25 machine is used at step 1 (left side of a one-dot chain line in FIG. 8), and a lot group 7 in which No. 28 machine is used (right side of a one-dot chain line in FIG. 8). Therefore, even if analysis is performed using a value of wafer yield and the mean value thereof, a clear significant difference cannot be recognized. On the other hand, when paying attention to the characteristic amount of data distribution, which is a difference in wafer yield in each lot, a clear significant difference can be recognized between the two lot groups 6 and 7. The noteworthy item is not limited to the item in the above (2), and may be any item of from (3) to (16) described above, or other items.

As described above, since each data distribution characteristic amount exists as an attribute value of each lot, the unit 22 which selects the data distribution characteristic amount selects each data distribution characteristic amount as a target variable sequentially. The unit 23 which extracts the rule file 24 by data mining performs the regression tree analysis, designating each data distribution characteristic amount as a target variable sequentially. As a result, a factor which has brought the data distribution characteristic amount can be discriminated, and hence more defective factors can be extracted than the factors extracted by the conventional analysis method. At this time, the processing of sequentially selecting the data distribution characteristic amount and the regression tree analysis are automatically executed in accordance with a program. As a result, the engineers need not consider which data distribution characteristic amount is to be selected as the target variable, and can perform analysis efficiently. It is effective particularly when it is unknown what is to be analyzed.

Even if a plurality of characteristic patterns can be seen, as in the case where both the strength of cycle 2 (pieces) and the strength of cycle 3 (pieces) exist in the same record, it becomes possible to evaluate the both characteristics. As a result, lack of information content can be eliminated, and an analysis result reflecting the actual situation can be obtained.

Figure 9:
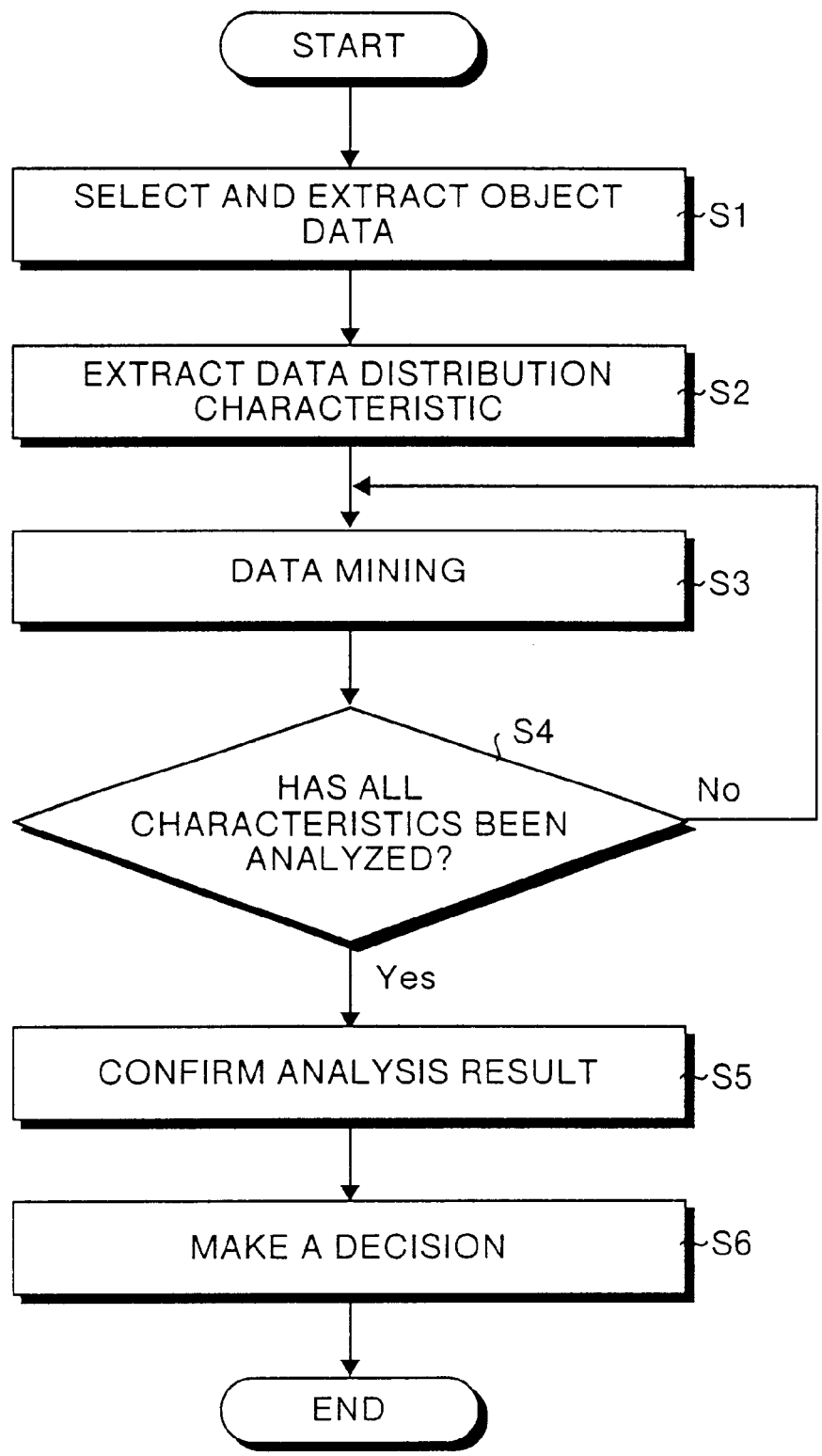
FIG. 9 is a flowchart showing the outline of one example of the data analysis method according to the first embodiment of the present invention.

The flow of the data analysis method according to the first embodiment of the present invention will be explained. FIG. 9 is a flowchart showing the outline of one example of the data analysis method according to the present invention. As shown in FIG. 9, when this data analysis method is started, at first, data to be analyzed, for example, yield value and various measurement values, is selected and extracted from the original data group 42 (step S1). Subsequently, processing for extracting at least one data distribution characteristic is performed with respect to the extracted data (step S2).

The data distribution characteristic amount to be analyzed is then selected, and data mining such as the regression tree analysis is performed, designating it as the target variable (step S3). After the regression tree analysis has been completed with respect to all the data distribution characteristics extracted at step S2 (step S4), the analysis result is output, and the engineer confirms it (step S5). Then, the engineer makes a decision based on the analysis result (step S6).

The data analysis method using the data distribution characteristic amount will be explained by way of specific examples, in order to clarify the features of the present invention. In general, when the wafer number is different, even in the wafer group in the same lot, the yield value and the electrical characteristic value in a unit of wafer is different, and these values show various variation pattern. The yield value and the electrical characteristic value are stored in a unit of wafer. Therefore, in the first embodiment, the variation pattern, such as yield value, with respect to the wafer number is used as the data distribution characteristic to perform analysis, over a plurality of lots. There is shown here an example in which multilateral analysis is performed with respect to a test substitution Nch transistor threshold voltage VT_N2 (hereinafter simply abbreviated as VT_N2), being an important electrical characteristic having a large influence on the property of the product. It is assumed herein that the history of used apparatus in each manufacturing step has an effect on the yield.

Figure 10:
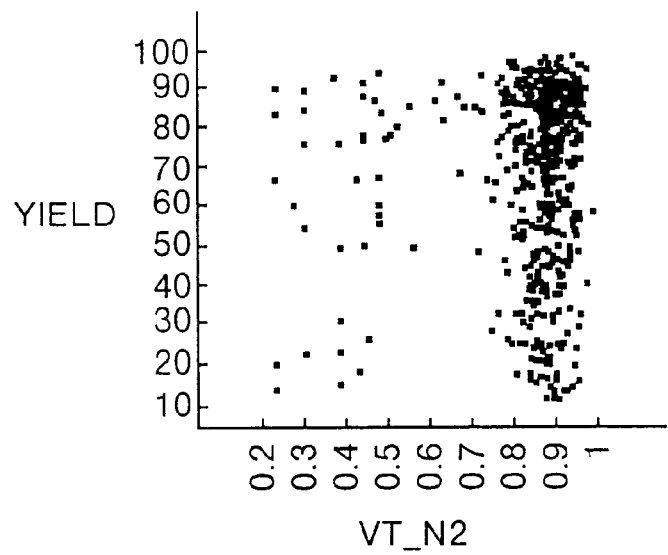
FIG. 10 is a characteristic diagram showing the relation between yield and VT_N2 as a specific example.
Figure 11:
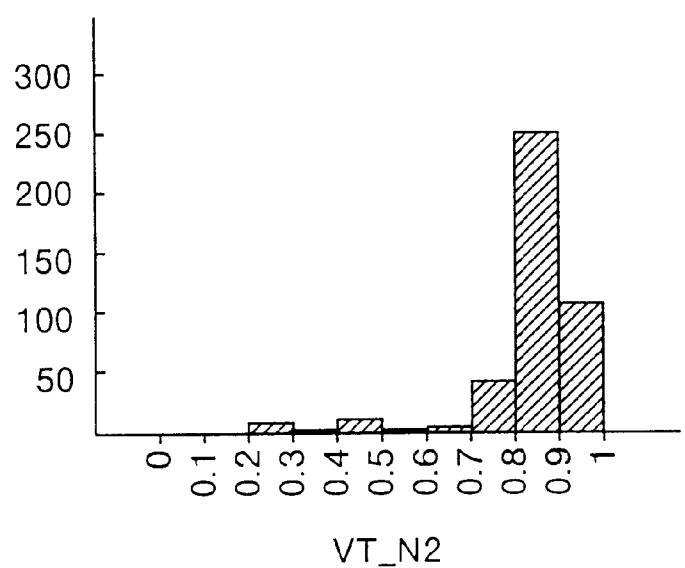
FIG. 11 shows a histogram of VT_N2 data obtained from all wafers as a specific example.
Figure 12:
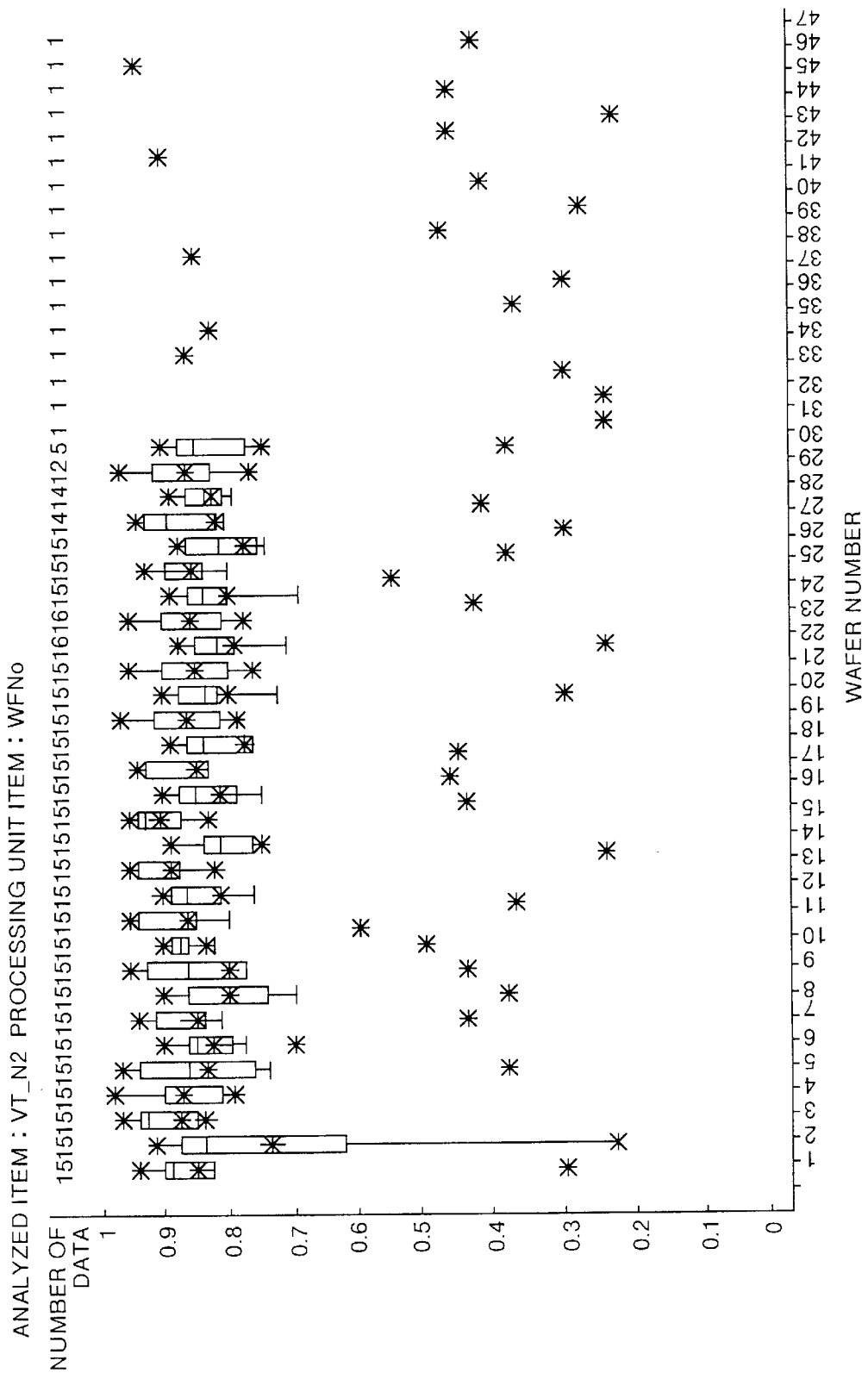
FIG. 12 shows a box and whisker chart in which all the VT_N2 data is displayed for each wafer number, as a specific example.

FIG. 10 is a characteristic diagram showing the relation between yield and VT_N2. From this figure, it is seen that the yield and VT_N2 have no relation at a glance. FIG. 11 shows a histogram of VT_N2 data obtained from all wafers. FIG. 12 shows a box and whisker chart in which all the VT_N2 data is displayed for each wafer number. It is difficult to extract a statistical significant difference from the results shown in these figures.

Figure 13:
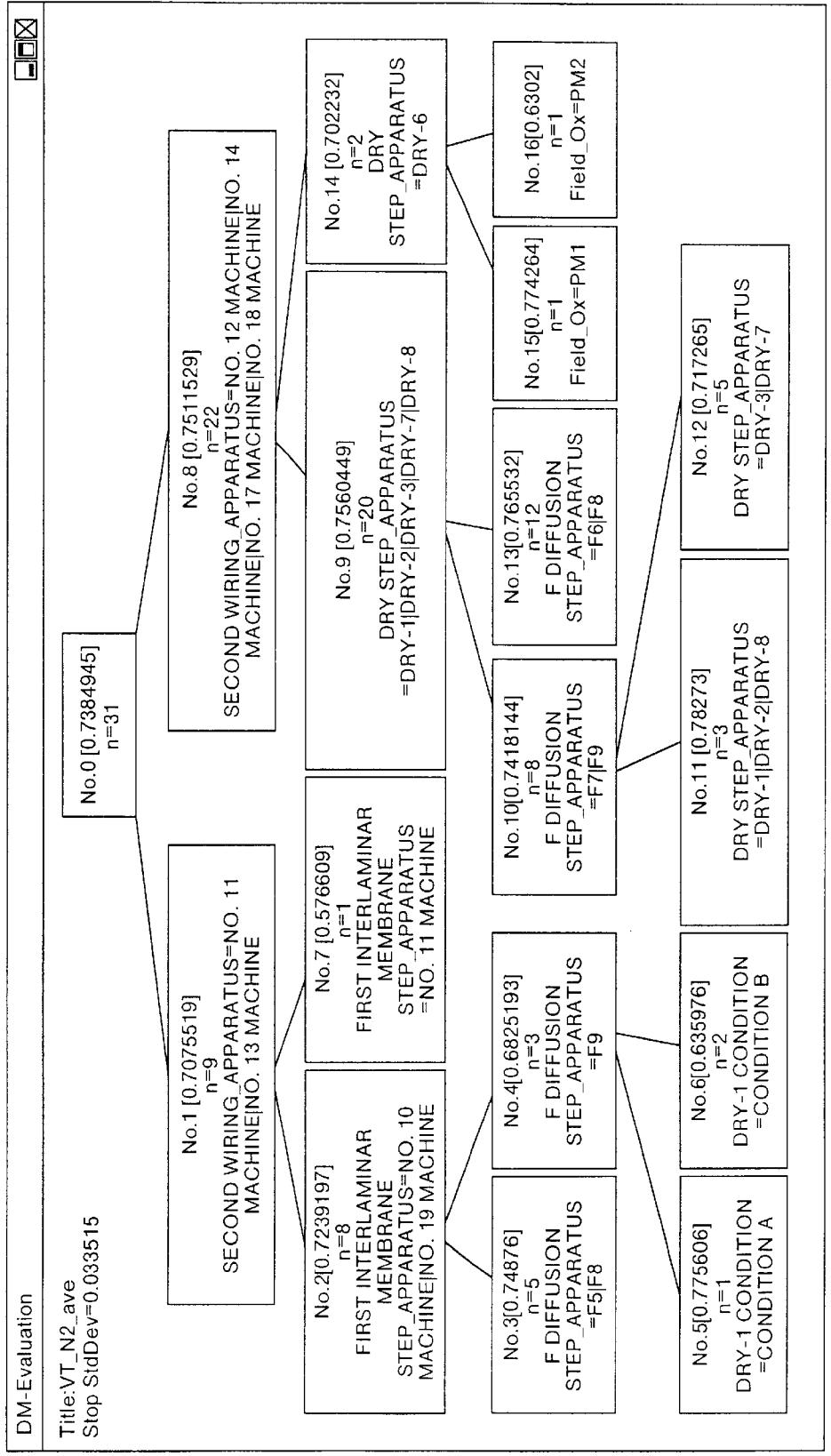
FIG. 13 is a diagram showing the result of performing regression tree analysis, by designating a mean value of VT_N2 in each lot as the target variable, and an apparatus name used in each step as the explanatory variable, as a specific example.

FIG. 13 is a diagram showing the result of performing the regression tree analysis, by designating a mean value of VT_N2 in each lot as the target variable, and an apparatus name used in each step as the explanatory variable. FIG. 14 is a diagram showing an example of a statistic list for evaluation with respect to this regression tree analysis. According to this regression tree analysis result, as shown in FIG. 13, what is made most significant with respect to the variation of VT_N2 is that which of No. 11 machine or No. 13 machine is used as a second wiring_apparatus or No. 12 machine, No. 14 machine, No. 17 machine or No. 18 machine is used. A box and whisker chart is shown in FIG. 15, in which all the VT_N2 data is displayed for each used apparatus name of the second wiring_apparatus. In this figure, a conspicuous significant difference cannot be seen. The statistic list for evaluation is output together with the regression tree diagram, but this will be explained later.

Figure 16:
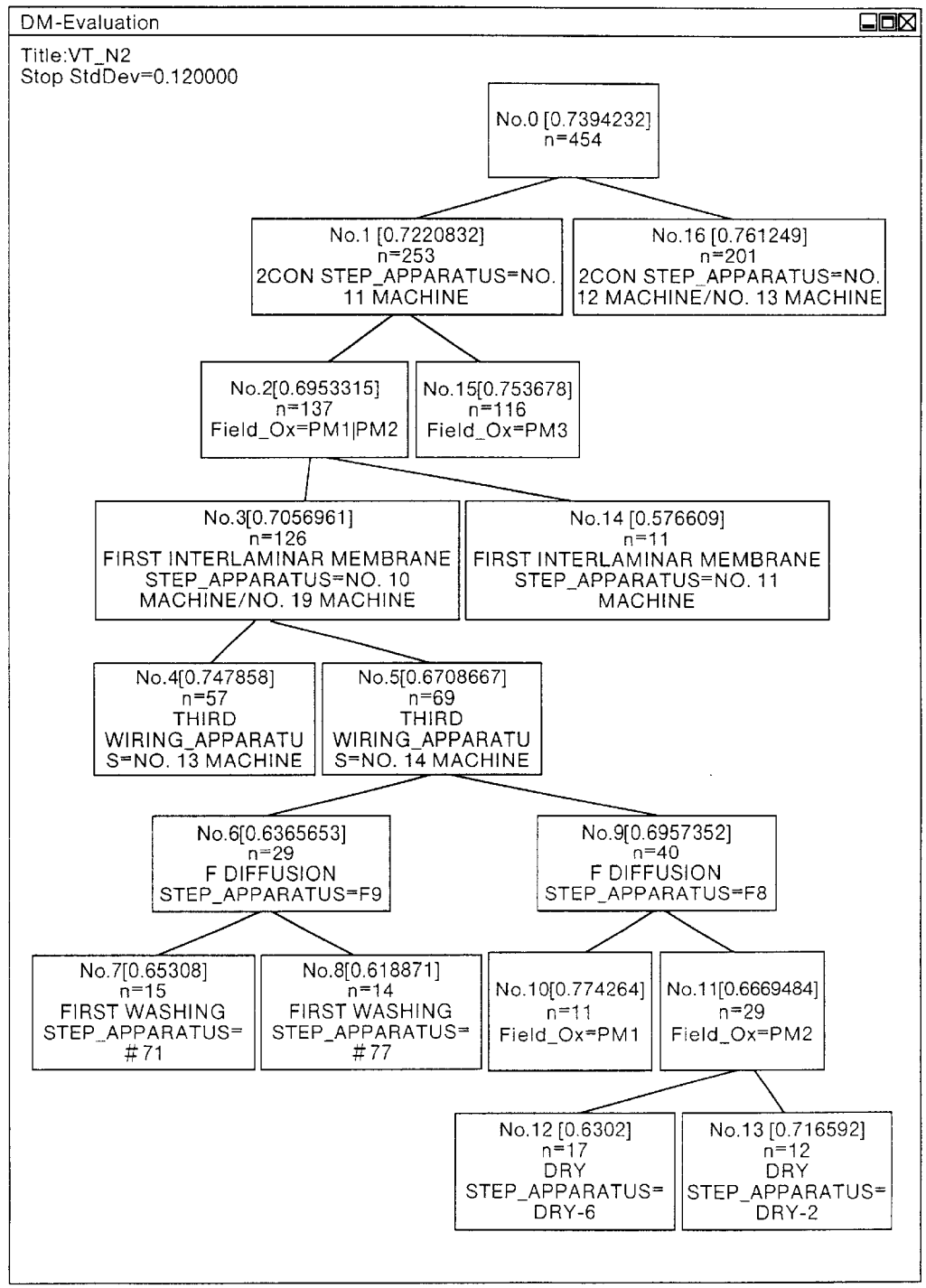
FIG. 16 is a diagram showing the result of performing regression tree analysis, by designating a value of VT_N2 of each wafer as the target variable, and an apparatus name used in each step as the explanatory variable, as a specific example.
Figure 18:
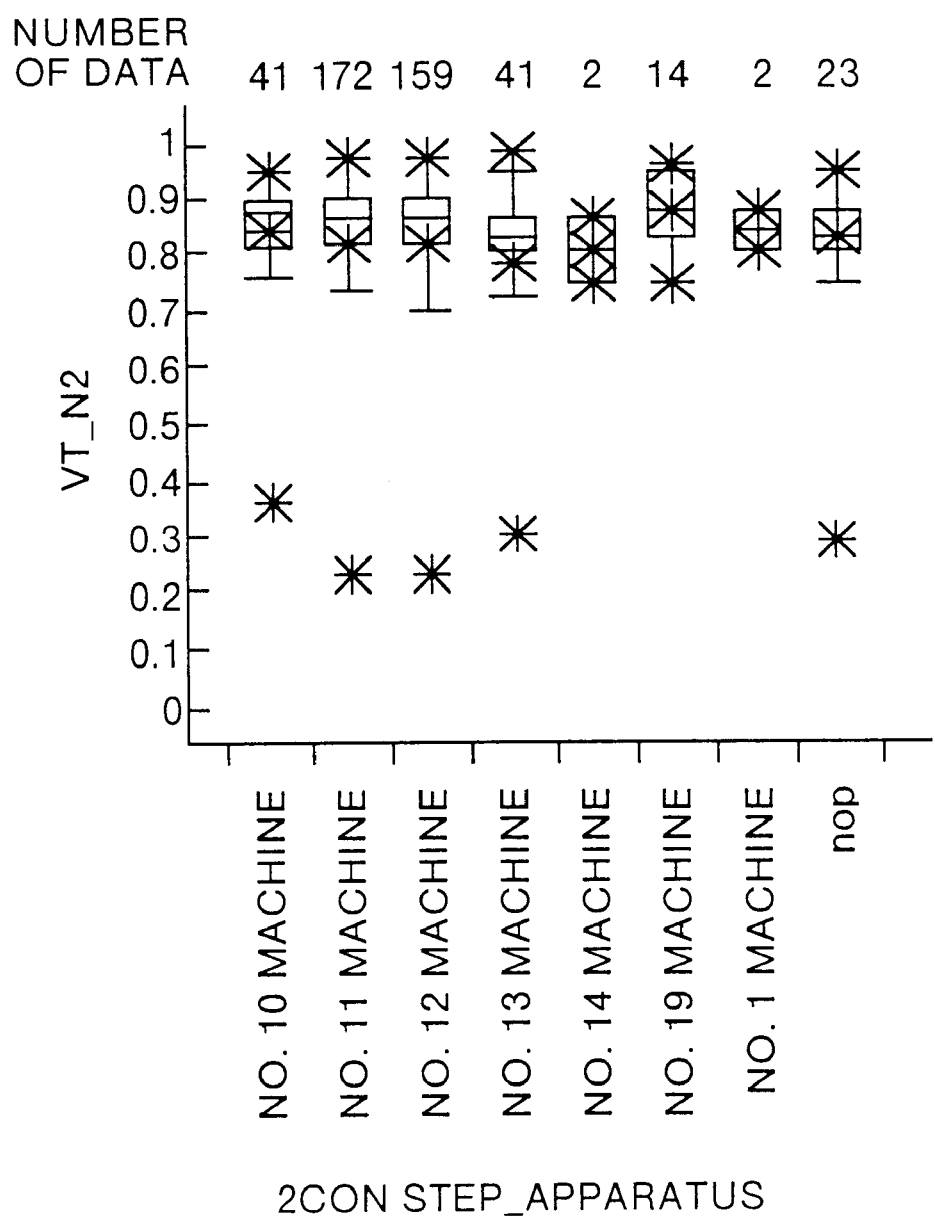
FIG. 18 shows a box and whisker chart in which all the VT_N2 data is displayed for each used apparatus name of a 2CON step_apparatus, as a specific example.

FIG. 16 is a diagram showing the result of performing the regression tree analysis, by designating a value of VT_N2 of each wafer as the target variable, and an apparatus name used in each step as the explanatory variable. FIG. 17 is a diagram showing an example of a statistic list for evaluation with respect to this regression tree analysis. According to this regression tree analysis result, as shown in FIG. 16, what is made most significant with respect to the variation of VT_N2 is that which of No. 11 machine is used as a 2CON step_apparatus or No. 12 machine or No. 13 machine is used. FIG. 18 shows a box and whisker chart in which all the VT_N2 data is displayed for each used apparatus name of a 2CON step_apparatus. Even in this figure, a conspicuous significant difference cannot be seen.

On the other hand, it becomes possible to elucidate the defective factor, by extracting the data distribution characteristic with regard to VT_N2 as described above to perform analysis. FIG. 19 is a diagram showing an example of a file which defines each amount of characteristic of VT_N2 for each lot by a CSV type. This file is output by the data distribution characteristic extraction unit 21 shown in FIG. 5.

Figure 20:
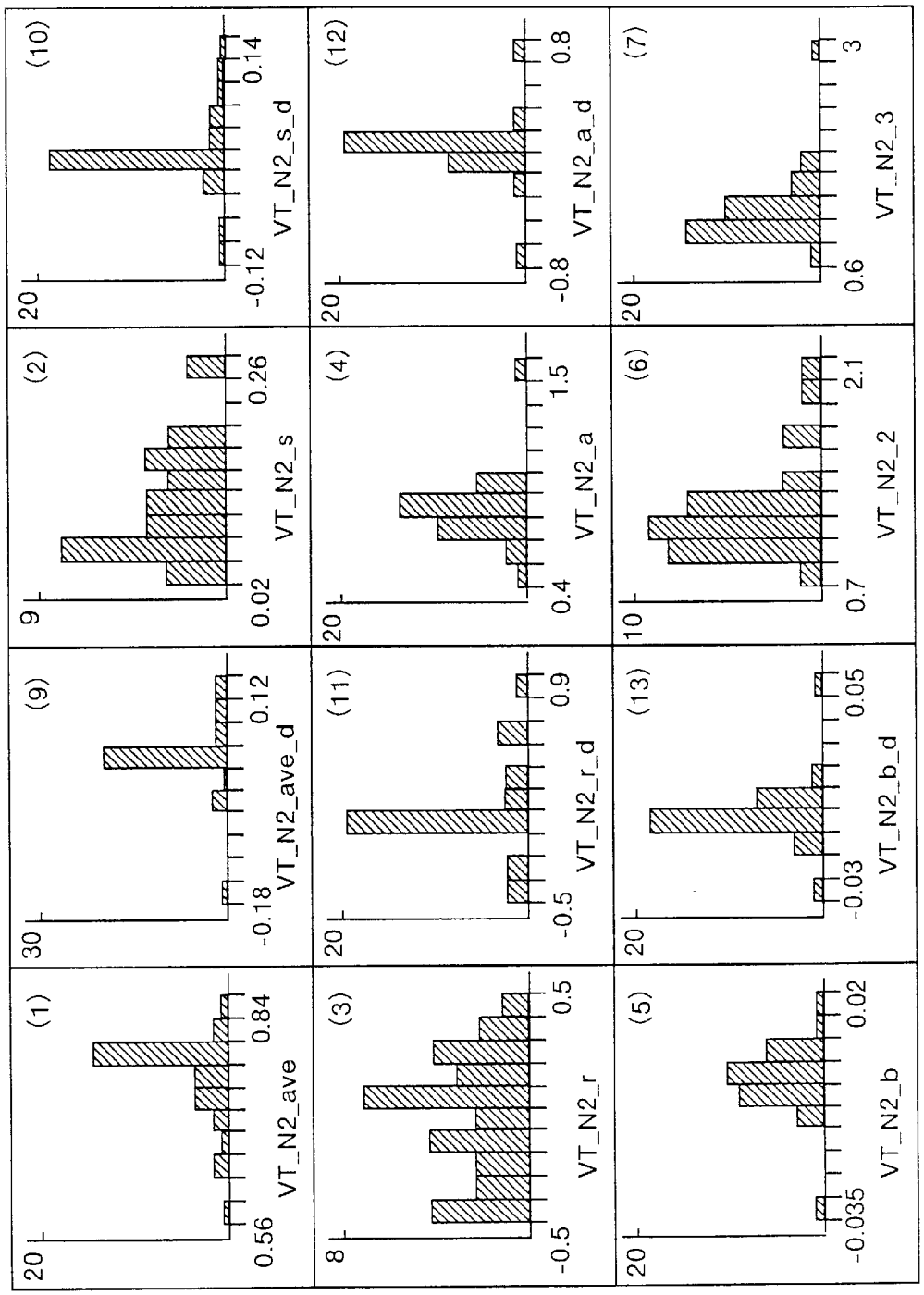
FIG. 20 is a diagram showing histograms of each characteristic amount in the in-lot distribution of VT_N2, as a specific example.

FIG. 20 is a histogram showing the characteristic amount in the distribution in lot of VT_N2, based on the CSV type data shown in FIG. 19. Here, with respect to the VT_N2, twelve characteristic items, that is, (1) mean value (VT_N2_ave), (2) standard deviation value (VT_N2_s), (3) correlation coefficient with respect to wafer number (VT_N2_r), (4) y-axis section in a linear approximation equation (VT_N2_a), (5) population regression coefficient (VT_N2_b), (6) periodicity of interval 2 of wafer number (VT_N2_2), (7) periodicity of interval 3 of wafer number (VT_N2_3), (9) difference in the mean value between the first half wafer and the second half wafer (VT_N2_ave_d), (10) difference in standard deviation value between the first half wafer and the second half wafer (VT_N2_s_d), (11) difference in correlation coefficient between the first half wafer and the second half wafer (VT_N2_r_d), (12) difference in y-axis section in the linear approximation equation between the first half wafer and the second half wafer (VT_N2_a_d), (13) difference in population regression coefficient between the first half wafer and the second half wafer (VT_N2_b_d), are extracted from the sixteen characteristic items (1) to (16) explained with reference to FIG. 7.

From FIG. 20, it is seen that any one of the characteristic amounts differs considerably. Therefore, if the regression tree analysis is performed, designating each characteristic amount as the target variable, the factor which has caused the significant difference in the respective characteristic amount, that is, the defective factor can be analyzed.

In order to obtain the analysis result efficiently, designating the data distribution characteristic as the analysis object, as shown in FIG. 21, there is prepared a file which defines apparatus name used in each step and the extracted characteristic amount for each lot, as the input data for the regression tree analysis. This file is prepared by combining a rule file 24 (see FIG. 22) which defines the used apparatus name in each step and the yield of lot as the input data at the time of analyzing the variation factor of the yield with the regression tree analysis, and the file shown in FIG. 19 for the same lot number.

Figure 23:
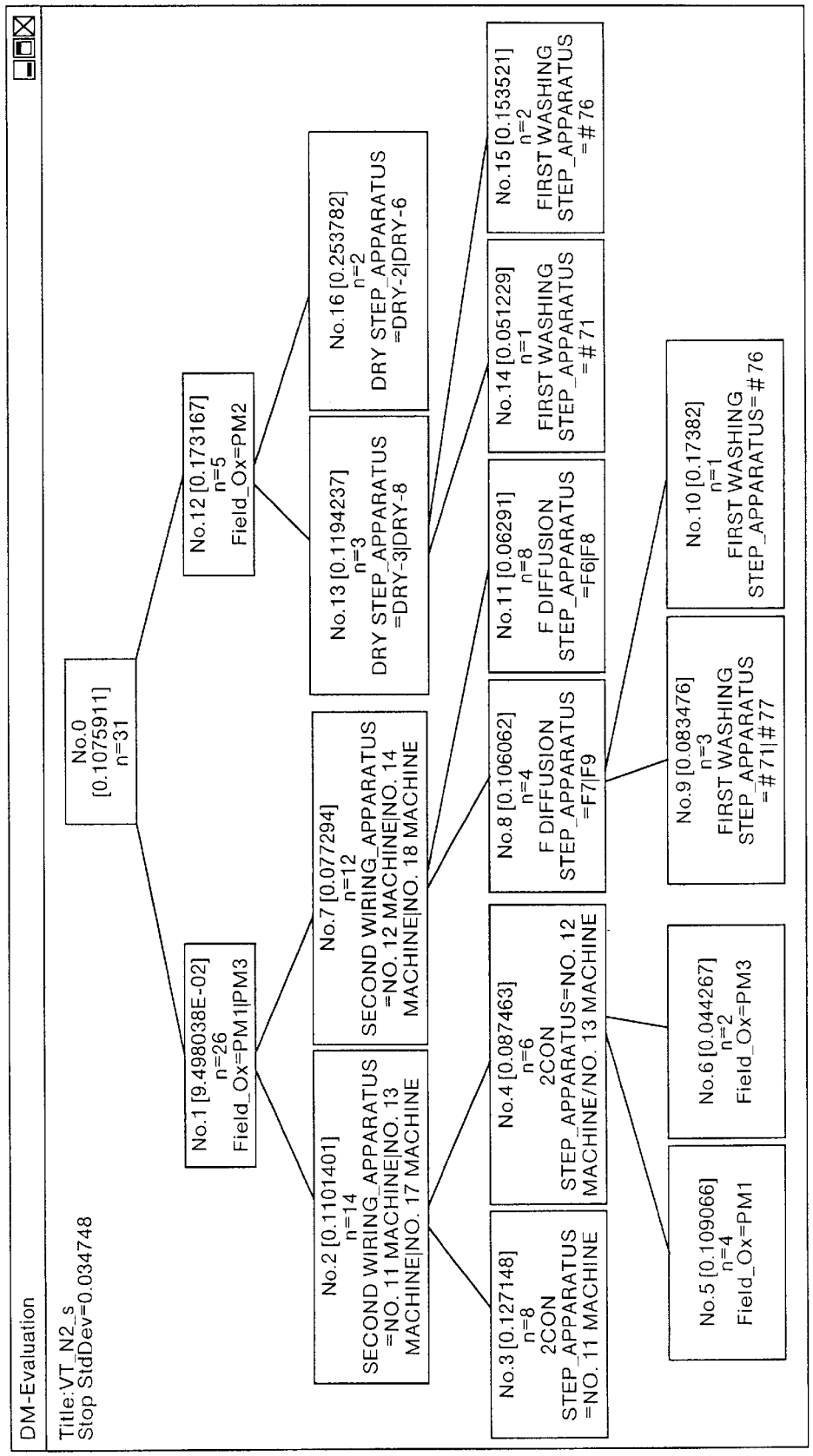
FIG. 23 is a diagram showing the result of the regression tree analysis, by designating a standard deviation value of VT_N2 in each lot as the target variable, and an apparatus name used inch step as the explanatory variable, as a specific example.

FIG. 23 is a regression tree diagram showing the result of the regression tree analysis performed for extracting the factor of difference caused in the VT_N2 lot, by designating (2) standard deviation value (VT_N2_s) described above as the target variable, and the apparatus name used in each step as the explanatory variable. FIG. 24 is a diagram showing an example of a statistic list for evaluation with respect to the regression tree analysis.

According to the regression tree diagram shown in FIG. 23, what is made most significant with respect to the variation in the standard deviation value of VT_N2 (VT_N1_s) is that which of PM No. 1 machine or PM No. 3 machine is used as a Field_Ox step_apparatus, or PM No. 2 machine is used. This is judged to have high reliability, since a significant difference can be clearly seen, when comparing respective values of the Field_Ox step_apparatus appearing for the first time (S ratio=0.3767, t=3.081), with respective values of the second wiring_apparatus and DRY step_euipment (S ratio>0.43, t<2.2) appearing for the second time and after, with regard to the S ratio and the t value or the like in the statistic list for evaluation.

Figure 25:
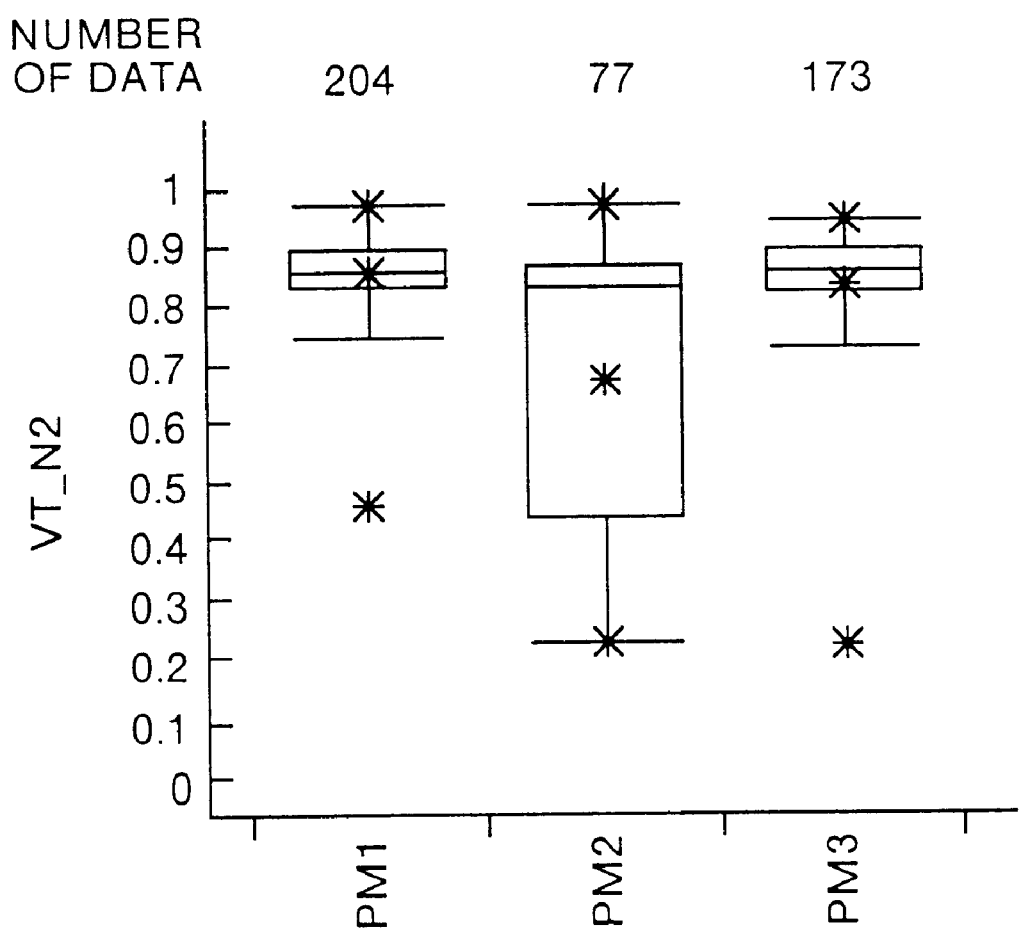
FIG. 25 is a diagram showing a box and whisker chart in which all the VT_N2 data is displayed for each used apparatus name of a Field_Ox step_apparatus, as a specific example.

In order to confirm this, the distribution of the VT_N2 value is shown in a box and whisker chart for each apparatus used in the Field_Ox step in FIG. 25. In FIG. 25, a clear significant difference can be recognized between the PM1 machine or PM3 machine and PM2 machine. That is to say, the effectiveness of the method according to the present invention is confirmed, in which analysis is performed using the distribution characteristic of the original data. The statistic list for evaluation, S ratio and t value will be explained later.

Figure 26:
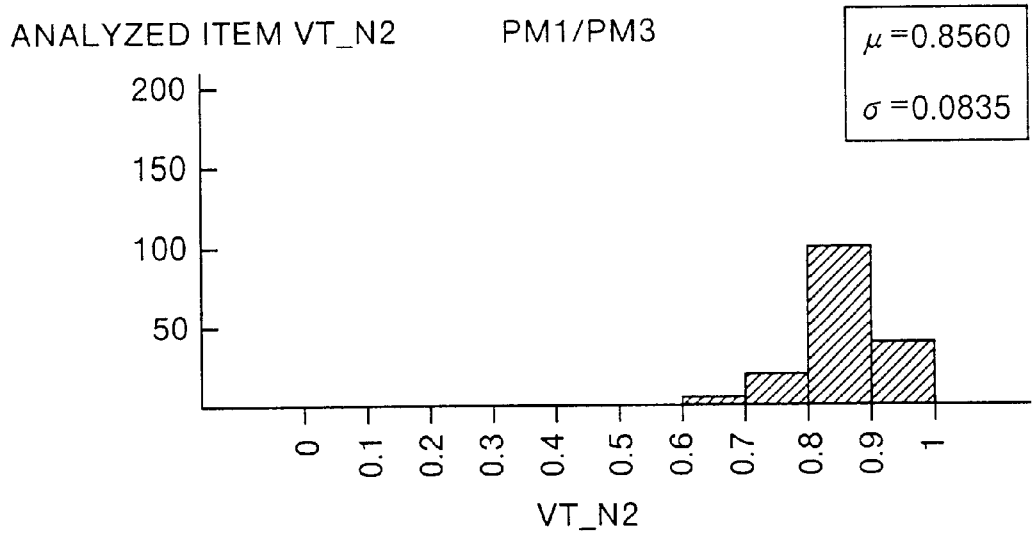
FIG. 26 is a diagram showing a histogram of VT_N2 of all wafers using a PM1 machine or a PM3 machine in the Field_Ox step, as a specific example.
Figure 27:
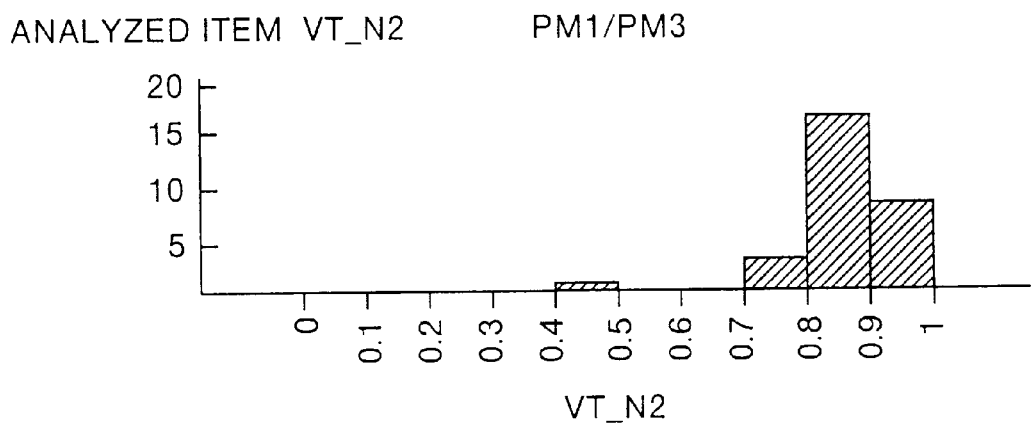
FIG. 27 is a diagram showing a histogram of VT_N2 of wafers in one lot, using a PM1 machine or a PM3 machine in the Field_Ox step, as a specific example.
Figure 28:
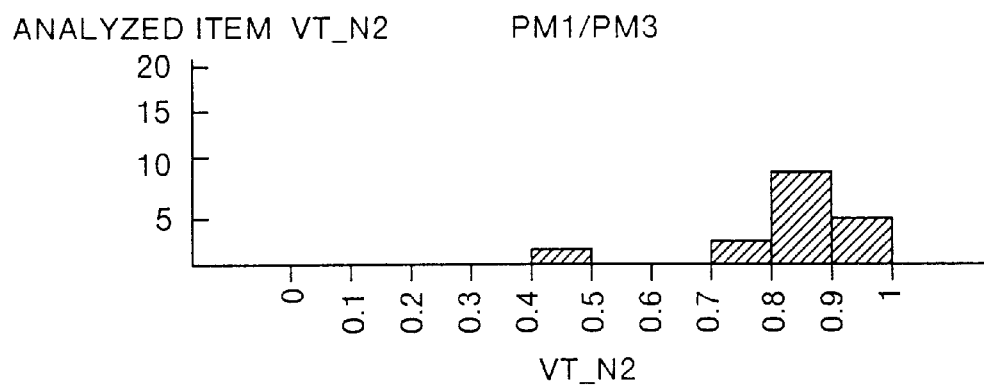
FIG. 28 is a diagram showing a histogram of VT_N2 of wafers in one lot, using a PM1 machine or a PM3 machine in the Field_Ox step, as a specific example.
Figure 29:
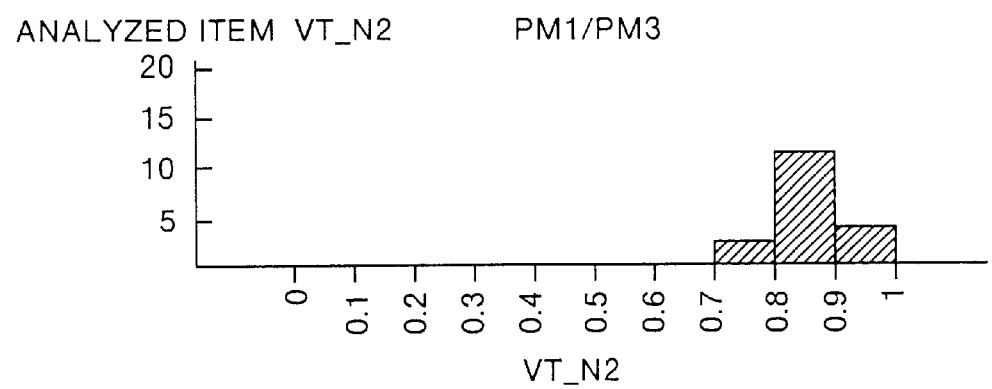
FIG. 29 is a diagram showing a histogram of VT_N2 of wafers in one lot, using a PM1 machine or a PM3 machine in the Field_Ox step, as a specific example.
Figure 30:
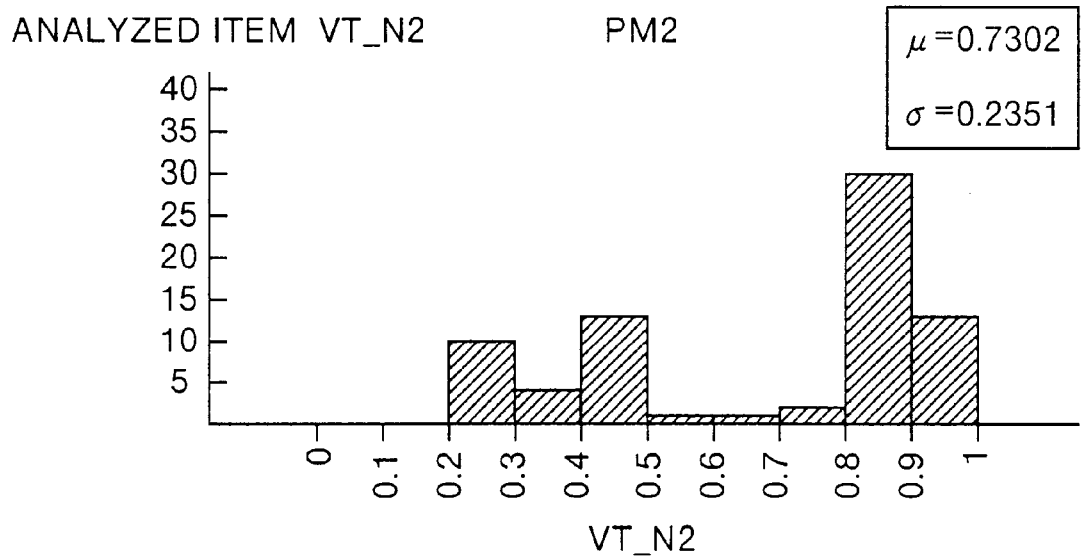
FIG. 30 is a diagram showing a histogram of VT_N2 of all wafers, using a PM2 machine in the Field_Ox step, as a specific example.
Figure 31:
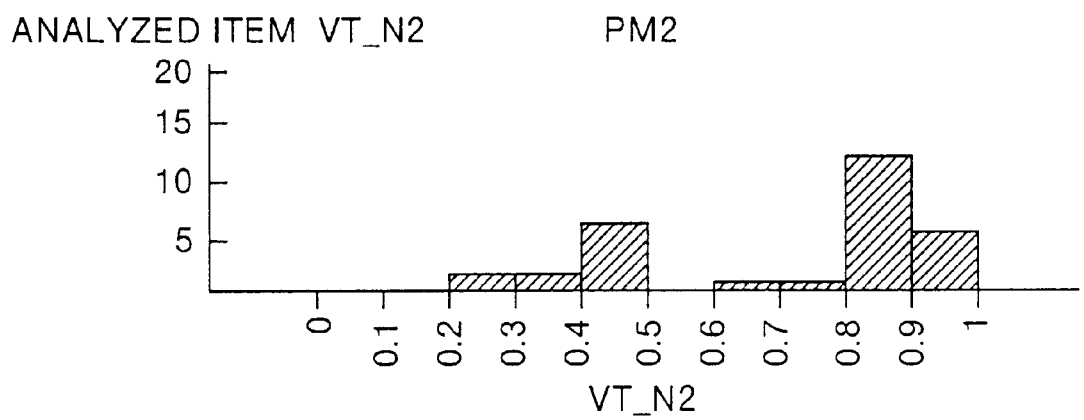
FIG. 31 is a diagram showing a histogram of VT_N2 of wafers in one lot, using a PM2 machine in the Field_Ox step, as a specific example.
Figure 32:
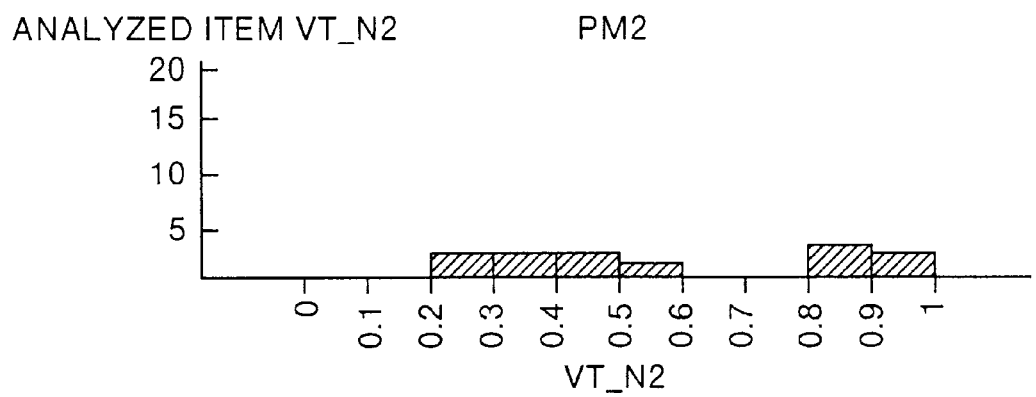
FIG. 32 is a diagram showing a histogram of VT_N2 of wafers in one lot, using a PM2 machine in the Field_Ox step, as a specific example.
Figure 33:
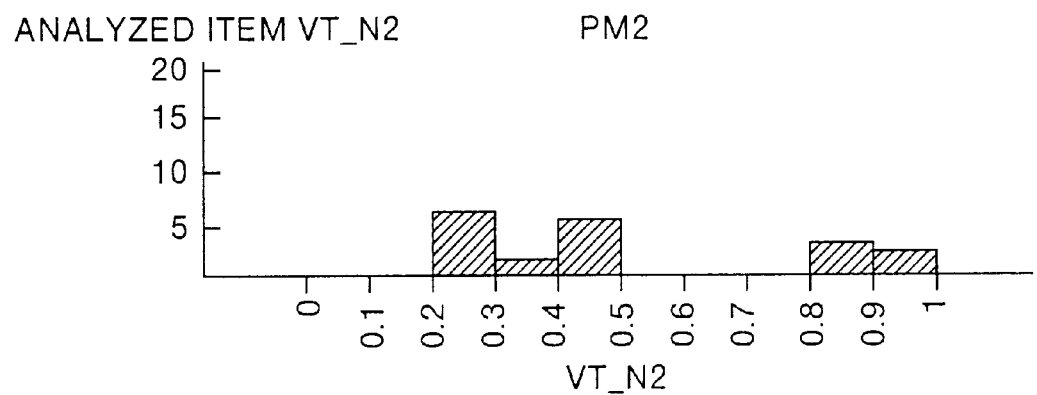
FIG. 33 is a diagram showing a histogram of VT_N2 of wafers in one lot, using a PM2 machine in the Field_Ox step, as a specific example.

FIG. 26 is a histogram showing the distribution of VT_N2 of all wafers which use the PM1 machine or the PM3 machine in the Field_Ox step, which has been found as a problematic step as a result of the regression tree analysis shown in FIG. 24 and FIG. 25. FIG. 27 to FIG. 29 is a histogram showing the distribution of VT_N2 of the wafers for different one lot using the PM1 machine or the PM3 machine in the Field_Ox step, respectively. FIG. 30 is a histogram showing the distribution of VT_N2 of all wafers using the PM2 machine in the Field_Ox step. FIG. 31 to FIG. 33 is a histogram showing the distribution of VT_N2 of the wafers for different one lot using the PM2 machine in the Field_Ox step, respectively.

As shown in FIG. 26 and FIG. 30, the mean value ($\mu$=0.8560) of VT_N2 of all wafers using the PM1 machine or PM3 machine, and the mean value ($\mu$=0.7302) of VT_N2 of all wafers using the PM2 machine are substantially the same. Therefore, it is difficult to extract a significant difference, even if the analysis is performed using the mean value as in the conventional case.

However, a clear significant difference can be seen, if comparing the standard deviation value ($\sigma$=0.0835) of VT_N2 of all wafers using the PM1 machine or PM3 machine, with the standard deviation value ($\sigma$=0.2351) of VT_N2 of all wafers using the PM2 machine. Therefore, as in the first embodiment, it becomes possible to extract a significant difference, which cannot be extracted by analyzing only the original data, as a defective factor, by paying attention to the data distribution characteristic, such as a difference in the original data.

As a result of performing detailed investigation actually with respect to the PM2 machine, based on the above-described analysis result, it has been found that a temperature distribution difference in the furnace of the PM2 machine is larger than the PM1 machine and the PM3 machine. Further, it has been found that it is due to the deterioration of a thermocouple, and the regular check method has been optimized. From the result of a regression tree analysis performed designating a lot yield as the target variable and the used apparatus name in each step as the explanatory variable, it has not been found that the PM2 machine is a factor causing a decrease in the yield. That is to say, the factor causing a yield decrease, which does not clearly appear in the yield value, is clarified according to the method of the present invention, in which a factor causing a significant difference in the standard deviation or the like of the electrical characteristic value in a lot is analyzed. In the first embodiment, edition of stored data, execution of the regression tree analysis and quantitative evaluation of the result by means of a peculiar method are executed automatically.

Figure 34:
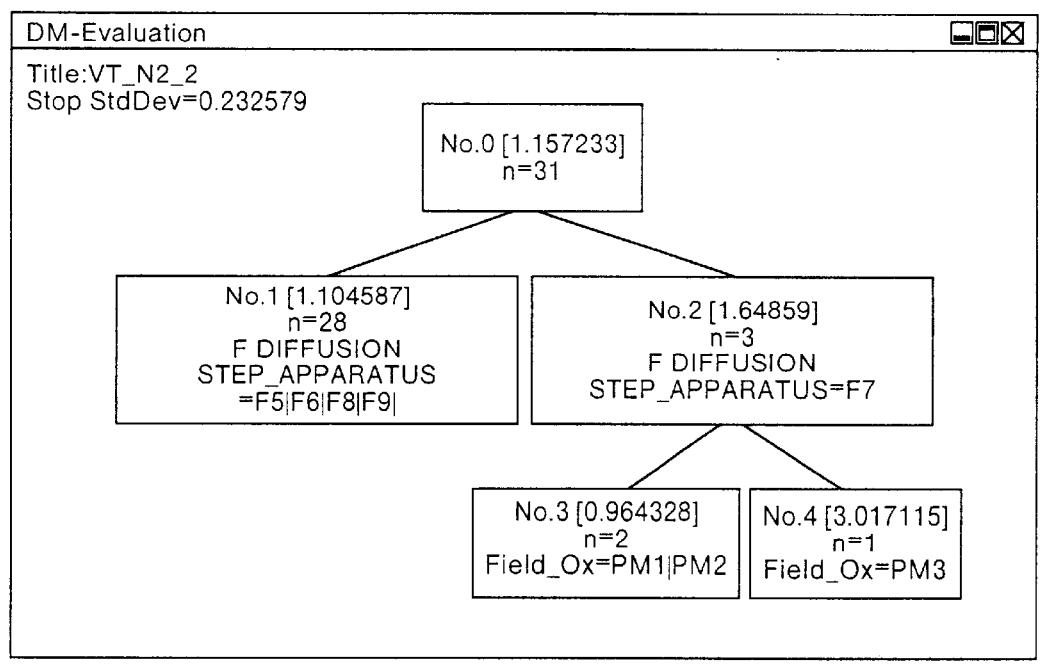
FIG. 34 is a diagram showing the result of the regression tree analysis, by designating a value of periodicity of interval 2 of the wafer number as the target variable, and an apparatus name used in each step as the explanatory variable, as a specific example.

FIG. 34 is a regression tree diagram showing the result of the regression tree analysis, by designating the above-described periodicity of interval 2 (VT_N2_2) of the wafer number as the target variable, and an apparatus name used in each step as the explanatory variable. FIG. 35 is a diagram showing an example of a statistic list for evaluation with respect to the regression tree analysis. According to the regression tree diagram shown in FIG. 34, what is most significant with respect to that the variation in lot of VT_N2_2 has a periodicity of 2 is that whether the F7 machine is used as the F diffusion step_apparatus, or F5 machine, F6 machine, F8 machine or F9 machine is used instead. It is seen that the periodicity of 2 is indicated stronger by about 50% in the case of using the F7 machine.

Figure 36:
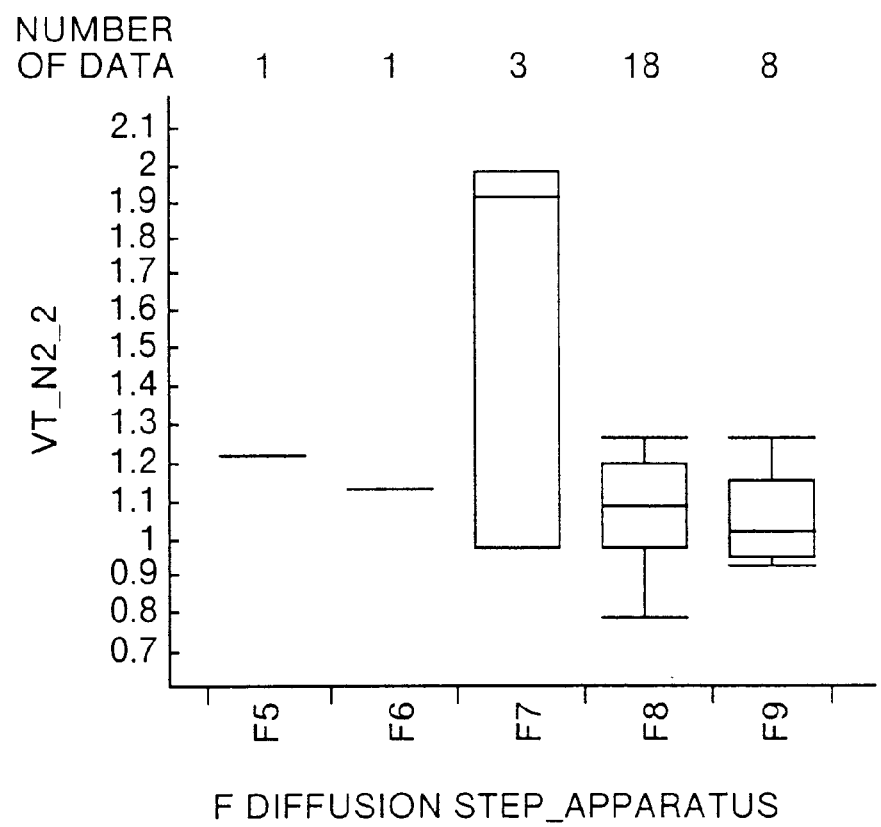
FIG. 36 is a diagram showing a box and whisker chart in which the value of periodicity of interval 2 of the wafer number is displayed for each used apparatus name of an F diffusion step_apparatus, as a specific example.

In order to confirm this, the distribution of the periodicity value (VT_N2_2) is shown in a box and whisker chart for each apparatus used in the F diffusion step in FIG. 36. In FIG. 36, a clear significant difference can be recognized between the F7 machine and the F5 machine, F6 machine, F8 machine or F9 machine. From the box and whisker chart in which the all VT_N2 data is displayed for each wafer number, the periodicity of 2 cannot be seen. From this example, the effectiveness of the method according to the present invention is also confirmed in which analysis is performed using the distribution characteristic of the original data.

Figure 37:
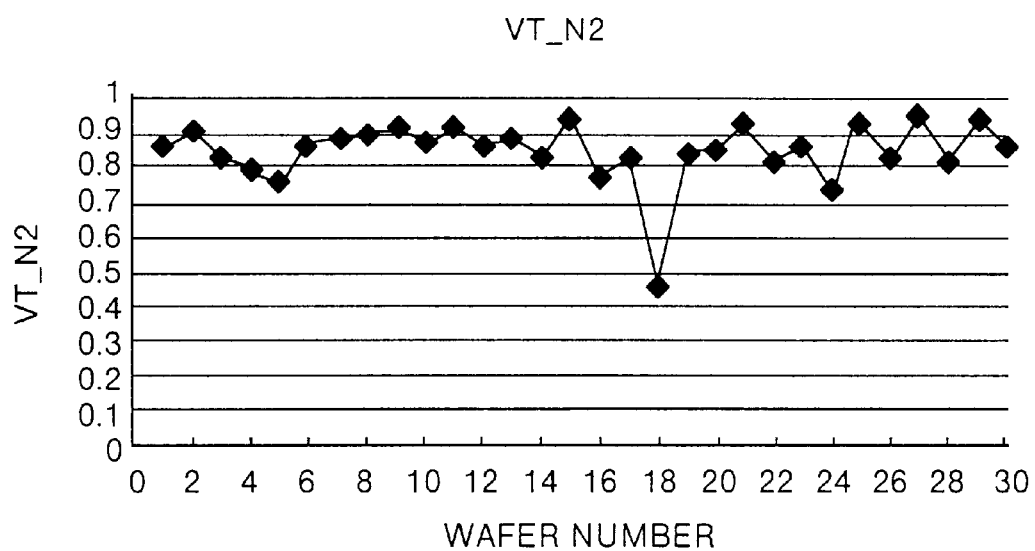
FIG. 37 is a diagram showing an in-lot variation of VT_N2 of wafers in one lot, using an F7 machine in the F diffusion step, as a specific example.
Figure 38:
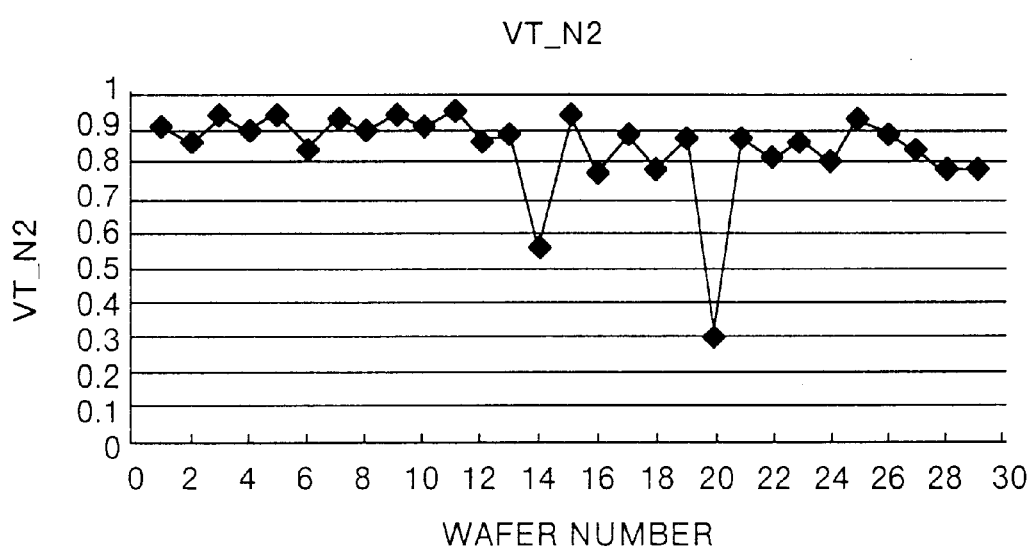
FIG. 38 is a diagram showing an in-lot variation of VT_N2 of wafers in one lot, using an F7 machine in the F diffusion step, as a specific example.
Figure 39:
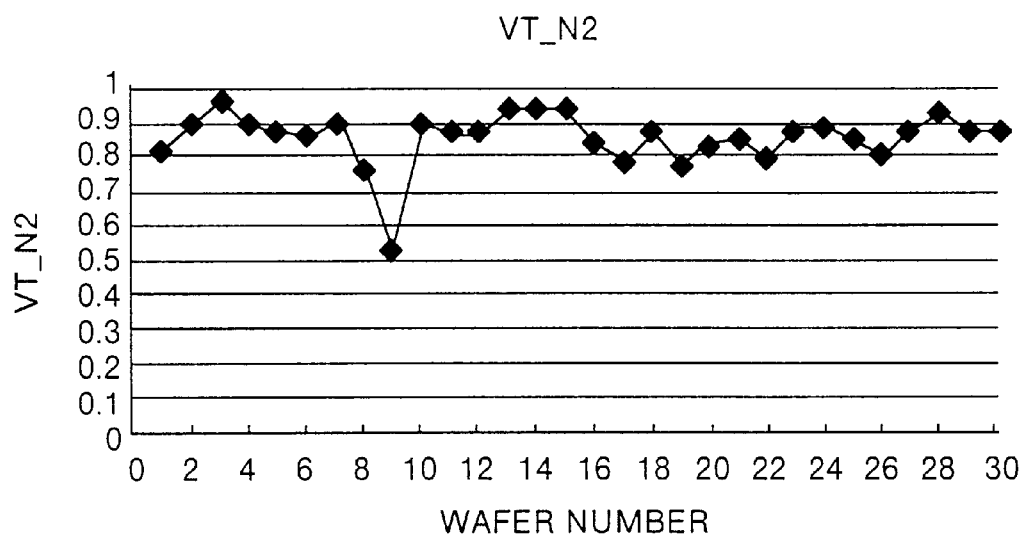
FIG. 39 is a diagram showing an in-lot variation of VT_N2 of wafers in one lot, using an F7 machine in the F diffusion step, as a specific example.
Figure 40:
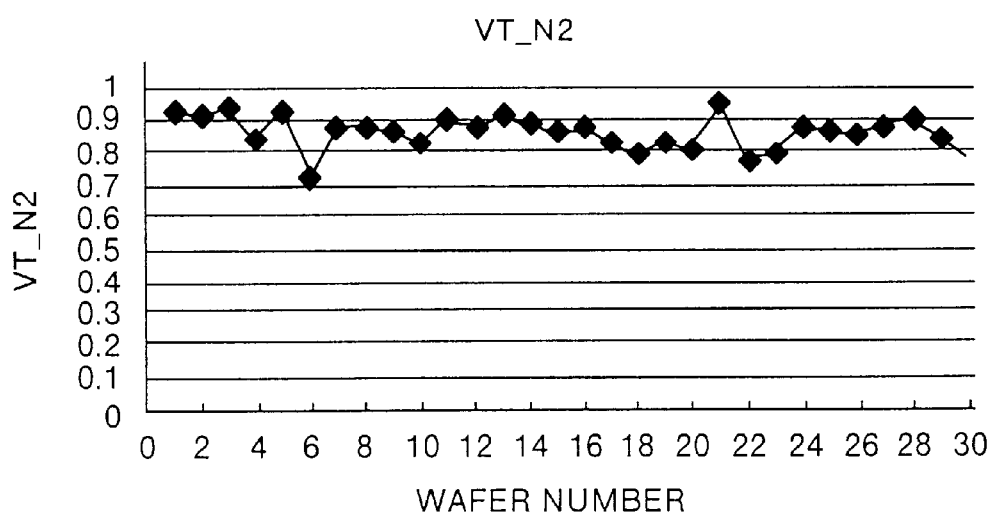
FIG. 40 is a diagram showing an in-lot variation of VT_N2 of wafers in one lot, using an F5 machine, F6 machine, F8 machine or F9 machine in the F diffusion step, as a specific example.
Figure 41:
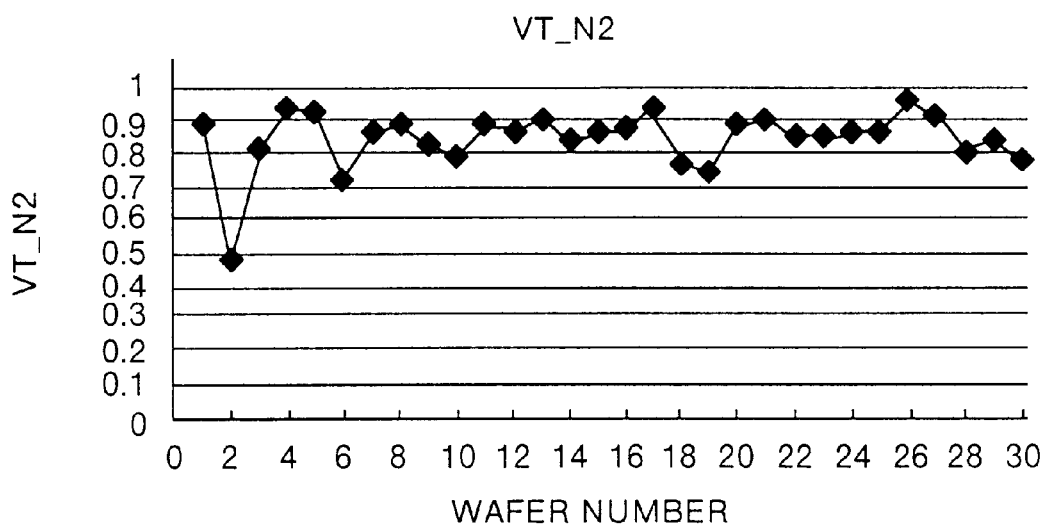
FIG. 41 is a diagram showing an in-lot variation of VT_N2 of wafers in one lot, using an F5 machine, F6 machine, F8 machine or F9 machine in the F diffusion step, as a specific example.
Figure 42:
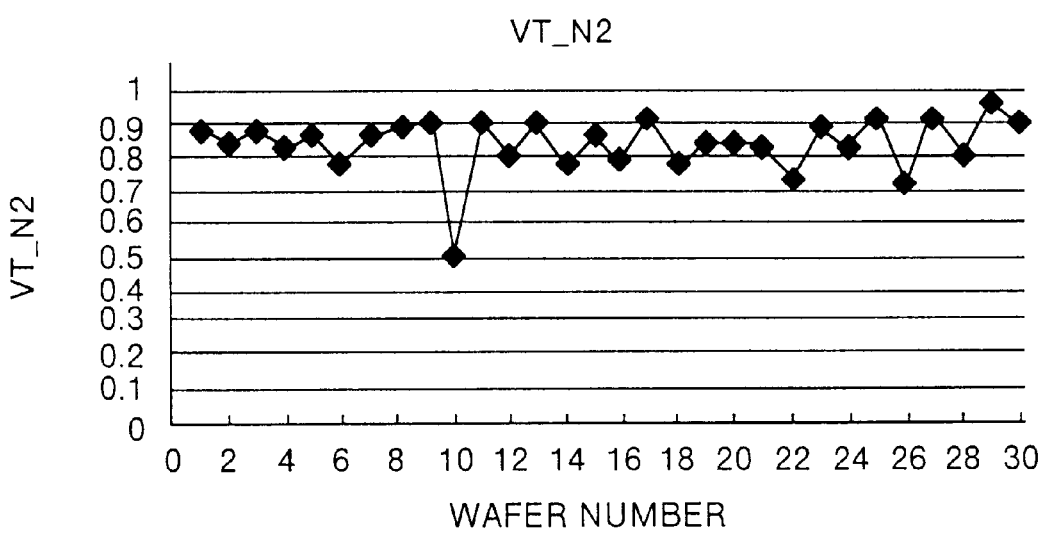
FIG. 42 is a diagram showing an in-lot variation of VT_N2 of wafers in one lot, using an F5 machine, F6 machine, F8 machine or F9 machine in the F diffusion step, as a specific example.

FIG. 37 to FIG. 39 is a histogram showing the variation in lot of VT_N2 of the wafers for different one lot using the F7 machine in the F diffusion step of the step causing the problem from the result of the regression tree analysis shown in FIG. 34 and FIG. 35. FIG. 40 to FIG. 42 is a histogram showing the variation in lot of VT_N2 of the wafers for different one lot using the F5 machine, F6 machine, F8 machine or F9 machine in the F diffusion step, respectively. From the above-described analysis result, the factor causing the variation in lot of VT_N2 is extracted, and the apparatus in the F diffusion step, being the apparatus in which the wafer is alternately used, is noted. It has been actually found that lots of particles are generated in one of the two chambers therein.

In the first embodiment, in the regression tree analysis, each characteristic amount extracted by using the same explanatory variables is selected as the target variable sequentially, to perform the regression tree analysis automatically, thereby a factor affecting each characteristic amount is extracted respectively. Particularly, in the case where it is not clear what is to be analyzed, the amounts of all characteristics that can be considered are extracted, and the regression tree analysis is executed by using these as the target variable. As a result, various analysis results are obtained as described above, and the item that can be considered to have the largest significant difference among them is designated as a candidate of the measures items for improving the yield. In this manner, many significant differences can be efficiently extracted, which cannot be extracted easily with the conventional analysis method.

The regression tree analysis and the statistic list for evaluation will be explained. At first, the regression tree analysis will be explained briefly. The regression tree analysis is an analysis which, targeting a set of records comprising explanatory variables indicating a plurality of attributes and a target variable affected thereby, discriminates an attribute and an attribute value which affects most strongly on the target variable. Rules indicating data characteristic and regularity are output from the unit 23 (regression tree analysis engine) which extracts the rule file 24 by performing data mining.

The processing of the regression tree analysis is realized by repeating bisection of the set based on the parameter value (attribute value) of each explanatory variable (attribute). At the time of set bisection, when it is assumed that the sum of squares of the target variable before the bisection is S0, and the sum of squares of the respective target variables of the two sets after the bisection is S1 and S2, the explanatory variable of the record to be bisected and the parameter value thereof are obtained, so that ΔS shown in an equation (1) becomes the largest, $$\Delta S = S0 - (S1 + S2) \tag{1}$$

The explanatory variables and parameter values thereof obtained here correspond to the branch point in the regression tree. Hereinafter, similar processing is repeated for the bisected set, to study the influence of the explanatory variable on the target variable. The above is the well known method of the regression tree analysis. With respect to a plurality of the high-rank bisection candidates, the following parameters (a) to (d) in addition to ΔS are used as quantitative evaluation of the results of the regression tree analysis, in order to understand the preciseness of the set bisection in more detail. These parameters are output as the statistic list for evaluation.

(a) S Ratio,

It is a parameter of a decreasing rate of sum of squares due to set bisection, indicating how much the sum of squares is decreased due to set bisection. The smaller is this value, the larger is the effect of the set bisection, and since the set bisection is performed precisely, a significant difference is large.

$$S \text{ ratio} = ((S1+S2)/2)/S0 \tag{2}$$

(b) t value,

The set is bisected by the regression tree analysis engine, and it is a value for verifying a difference in the average of the bisected two sets (/X1, /X2). Here, "/" indicates an upper line. The t-verification of the statistics becomes a reference indicating a significant difference in the mean value of the target variable in the bisected set. If it is assumed that the freedom, that is, the number of data is the same, as t becomes larger, the set is bisected more clearly, and the significant difference becomes large.

At this time, in the case where there is no significant difference in the dispersion of the bisected set, the t-value is obtained by a following equation (3), and in the case where there is a significant difference in the dispersion of the bisected set, the t-value is obtained by a following equation (4). Here, N1 and N2 is respectively a number of elements of the bisected set 1 and set 2. /X1 and /X2 is respectively an average of each set after the bisection. S1 and S2 is respectively a sum of squares of the target variable of each set.

$$t = \frac{|\overline{X1} - \overline{X2}|}{\sqrt{\frac{S1+S2}{N1+N2-2} \times \left(\frac{1}{N1} + \frac{1}{N2}\right)}} \tag{3}$$

$$t = \frac{|\overline{X1} - \overline{X2}|}{\sqrt{\frac{S1}{N1^2} + \frac{S2}{N2^2}}} \tag{4}$$

(c) Difference in Mean Value of Target Variable of Bisected Set,

The larger is this value, the larger is the significant difference.

(d) Number of Data of each Bisected Set,

The smaller is a difference between those two, the smaller is the influence by means of the abnormal value (noise).

According to the above-described first embodiment, not only the original data and the mean value thereof, as in the conventional case, but also various data distribution characteristics existing in the original data group, such as a difference in the original data and a variation pattern in a lot, are extracted, and each characteristic amount is selected sequentially as the target variable to perform analysis. As a result, a factor causing each characteristic amount is evaluated and extracted automatically and quantitatively, and the data can be seen multilaterally, and more information can be extracted. Therefore, the relativity and significant difference, which are covered with various data and cannot be discriminated heretofore, can be extracted objectively without relying on the subjective view of an engineer, and efficiently and quantitatively.

In the first embodiment, a series of procedure, from extraction of a characteristic amount to extraction of the factor thereof, can be automatically performed. Therefore, the variation condition of a semiconductor manufacturing line and the factor thereof can be always monitored automatically by setting in a predetermined manner.

The present invention is not limited to the above-described first embodiment, and can be applied in a wide range. In the situation where there are lots of defective factors and there are many lots having poor yield, for example, at the time of starting a new variety, the covered factor may be found or the factor can be narrowed, by performing not only the investigation of the step causing the problem by using the original data and the mean value, but also performing the investigation of the step causing the problem from the data distribution characteristics in the lot and the wafer.

Figure 56:
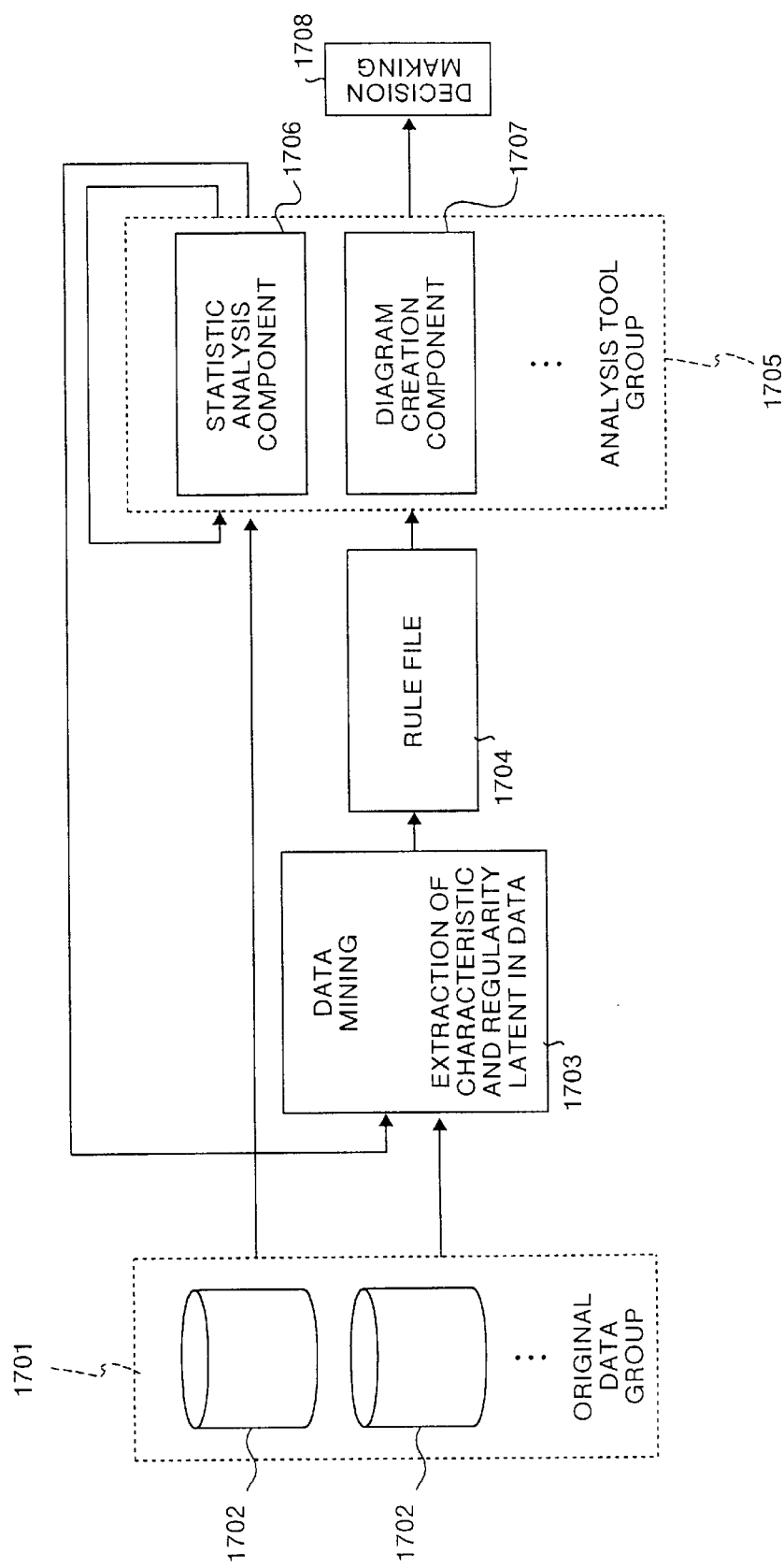
FIG. 56 is a diagram showing one example of functional configuration of a data analysis apparatus.

FIG. 56 is a diagram showing one example of functional configuration of a data analysis apparatus, which introduces data mining according to a second embodiment of the present invention. The data mining unit 1703 performs processing for extracting characteristics and regularity latent in the data, based on each individual original data extracted from each database 1702 in the original data group 1701, to prepare a rule file 1704. An analysis tool group 1705 has a statistic analysis component 1706 and a diagram creation component 1707, and analyzes the individual original data extracted from the database 1702 based on the rule file 1704.

The analysis result is fed back to the analysis tool group 1705 and the data mining unit 1703. The data mining unit 1703 performs data mining based on the analysis result of the analysis tool group 1705 and the original data group 1701. The analysis tool group 1705 performs analysis based on the individual original data extracted from the rule file 1704 and the database 1702, and the own analysis result. The decision making (section) 1708 makes a decision based on the analysis result of the analysis tool group 1705.

In the case where the data mining is applied in the yield data analysis, measures for improving the yield are determined based on the data mining result, or it is judged whether to perform the measures, or the effect of the measures is estimated. For that purpose, quantitative evaluation and accuracy of the data mining result become necessary.

Of the discriminal tree analysis, being one method of data mining, the regression tree analysis is particularly effective. One of the advantages of the regression tree analysis is that the result thereof is output as an easily understandable rule, and it is expressed in a general language, or a database language such as SQL language. Therefore, it becomes possible to effectively use the reliability and accuracy of these results, and to perform effective decision making based on the results, and to set up an action (that is, measures, etc.).

Figures 43, 44:
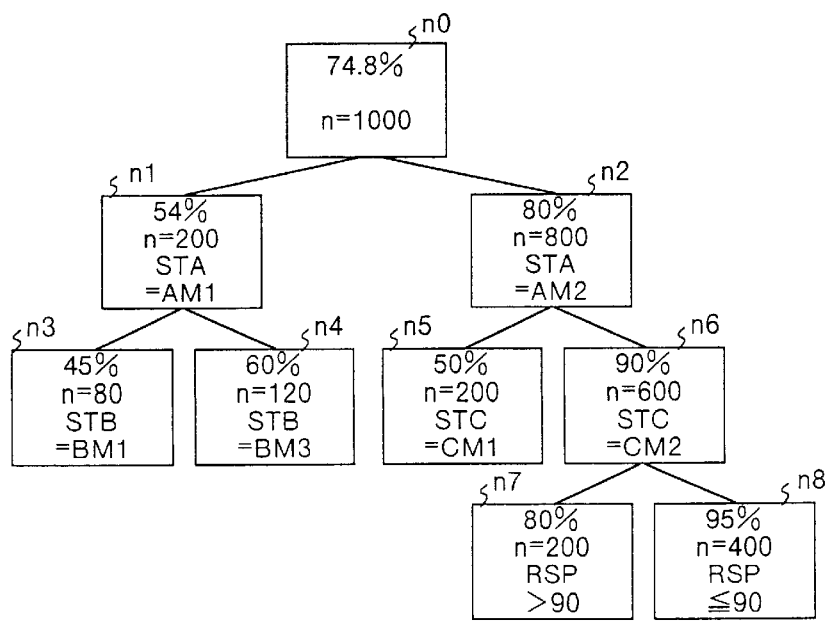
FIG. 43 is a diagram showing an example of input data of the regression tree analysis.
FIG. 44 is a diagram showing an example of the regression tree.

FIG. 43 shows a format of data example, being an input for the regression tree analysis. The record is in a unit of wafer number, and each record has apparatus 411 to be used in each manufacturing step, electric characteristic data 412 and wafer yield 413. The explanatory variable 401 is used apparatus 411, electric characteristic data 412, or the like. The target variable 402 is yield 413. For example, it is assumed that what has an effect in yield is the used apparatus 411 and the electric characteristic data 412. The regression tree diagram and the statistic list for evaluation, which are the results of the regression tree analysis by means of this data, are shown in FIG. 44 and FIG. 45.

FIG. 44 is a regression tree diagram, being the result of the regression tree analysis. Route node n0 is bisected into node n1 and node n2. Node n1 is bisected into node n3 and node n4. Node n2 is bisected into node n5 and node n6. Node n6 is bisected into node n7 and node n8.

FIG. 45 is a diagram showing A STATISTIC FOR EVALUATION of an explanatory variable at the time of the first bisection. For example, the mean value Ave of the target variable of the whole set is 75, the standard deviation s is 12, and the number of data N is 1000. Lists 601 to 604 indicate, from the left, ranking by significant difference, S ratio, t value, difference in mean value of target variable of bisected set, number of data of each bisected set, attribute name of bisected set (explanatory variable), attribute value (parameter value) of bisected two sets and magnitude correlation of the target variable. These lists 601 to 604 are grouping candidates by means of the value of ΔS shown in the equation (1) of the bisected attribute value (explanatory variable), and are arranged in the order of large size of the significant difference (ΔS) FIG. 44 shows that the node n0 is bisected into node n1 and node n2 based on the first candidate 601.

In the case where a set n0 of the all wafers in FIG. 44 is bisected into two sets n1 and n2, based on the evaluation value of ΔS in the equation (1), what affects most on the yield is which of AM1 or AM2 is used at step A, and the latter has better yield. This regression tree diagram can be obtained by repeating similar set bisection, with respect to the bisected set. With respect to the wafer group using AM2 at step A and CM2 at step C, the condition that the electric characteristic data RSP is not larger than 90 is most effective (has high yield).

FIG. 46 is equal to FIG. 44, and shows the correlation between yield of the bisected wafer set, used apparatus in a specific step and electric characteristic data. As the explanatory variable appears in the upper hierarchy in the regression tree diagram in FIG. 44, the influence on the target variable increases. The average yield of the whole wafers is 74.8%, but the regression tree analysis automatically extracts that there are such a characteristic and regularity, if it is branched into several sets in relation to the used apparatus and electric characteristic data. As a result, the regression tree analysis becomes a key to the yield analysis.

In the regression tree diagram in FIG. 44, the upper two hierarchies are due to a difference in the used apparatus. Therefore, in the analysis using the whole wafers, what affects most on the yield is the difference in the used apparatus, even if the complex condition is included. It seems that the electric characteristic data does not affect much. However, it is seen from FIG. 44 and FIG. 46 that RSP is most effective on the yield with respect to the wafer group using AM2 at step A and CM2 at step C.

A calculation example of the bisected confounding degree and the bisected independence degree will be explained. In the regression tree analysis, the confounding degree (confounding condition, degree of being not independent) of the bisected condition of each set, performed for obtaining the most significant explanatory variable with respect to the target variable is statistically caught, to thereby clarify other explanatory variables confounding with explanatory variables which is assumed to have a large significant difference. The calculation example of the bisected confounding degree and the bisected independence degree will be explained, with reference to FIG. 47.

Firstly, of the explanatory variables, the one in which the confounding degree is desired to evaluate is designated as a reference explanatory variable 801.

Secondly, each record constitutes a table in which "L" or "H" is made a data value for each explanatory variable. Here, H belongs to a set in which the target variable at the time of bisecting a set has a high value in the regression tree analysis, and L belongs to a set in which the target variable at the time of bisecting a set has a low value in the regression tree analysis, respectively. At the time of bisecting a set, L and H are determined for each explanatory variable of the whole records.

Thirdly, as an evaluation value of coincidence of L and H of each comparison explanatory variable 802 based on the reference explanatory variable 801, the bisected confounding degree DEP is defined as in an equation (5), by designating the number of records in which L and H coincide as Na, and the number of whole records as N. The range of the bisected confounding degree DEP is −1 to 1, and the bisected confounding degree is 1, if it is completely confounded, and 0 if it not confounded at all, and −1 if it is an inversed confounding.

$$DEP=(2 \times Na/N)-1 \qquad (5)$$

Further, the bisected independence degree IND is defined as in an equation (6), based on the bisected confounding degree DEP. The range of the bisected independence degree IND is 0 to 1, and the bisected independence degree is 1, if it is completely independent, and 0 if it not independent at all.

$$IND=1-|DEP| \qquad (6)$$

Fourthly, the above bisected confounding degree DEP and bisected independence degree IND are determined between one reference explanatory variable 801 and other explanatory variables 802, and it is designated as an evaluation standard between explanatory variables. It is optional which explanatory variable is designated as the reference explanatory variable. However, it is effective to designate the one determined to have a large significant difference by the set bisection in the uppermost hierarchy, with respect to the target variable in the regression tree analysis, as the reference explanatory variable, in view of the usefulness thereof.

Fifthly, it can be quantitatively evaluated how much the difference is between the condition that each comparison explanatory variable 802 belongs to each set of L and H and that of the reference explanatory variable 801, by determining the above bisected confounding degree DEP and bisected independence degree IND.

The confounding degree of the explanatory variable can be quantitatively evaluated based on the set bisection result of the regression tree analysis, by determining the bisected confounding degree and/or bisected independence degree. It becomes possible to automatically extract an explanatory variable having a large significant difference obtained by the regression tree analysis and other explanatory variables confounding therewith, by combining the evaluation with the regression tree analysis.

The bisected confounding degree can be evaluated for any explanatory variable designated as an object of the regression tree analysis. However, in view of the effectiveness thereof, it is statistically grasped how much an explanatory variable listed in the high rank of the first bisection candidate in FIG. 45 (=reference explanatory variable, listed in the statistic list for evaluation) is confounding with other optional explanatory variable, to extract a noteworthy explanatory variable confounding with an explanatory variable having a large significant difference. The explanatory variable to be analyzed for the confounding degree with the reference explanatory variable 801 is designated as a comparison explanatory variable 802, and both of these are selected from the statistic list for evaluation in FIG. 44. The calculation example of the bisected confounding degree and the bisected independence degree will be explained with reference to FIG. 47.

FIG. 47 shows wafer number 803, comparison explanatory variable 802, reference explanatory variable 801, yield 804 in the x-axis, and high yield group 811 of reference explanatory variables, low yield group 812 of reference explanatory variables, calculating formula 813 of bisected confounding degree, bisected confounding degree 814 and bisected independence degree 815 in the y-axis.

From the high rank candidate items (statistic list for evaluation) in FIG. 45, items to be made a reference for comparison is determined as a reference explanatory variable 801. In FIG. 47, ST3 is the reference explanatory variable 801. Other explanatory variables are designated as comparison explanatory variables 802. In FIG. 47, ST1, ST2 and WET2 are comparison explanatory variables 802. Each comparison explanatory variable 802 is compared with the reference explanatory variable 801. In ST1, ST2, ST3 and WET2, being the explanatory variables, "L" being a low yield group is indicated by hatch, and "H" being a high yield group is indicated by without hatch.

ST3, being the reference explanatory variable 801, can be divided into a high yield group 811 of the reference explanatory variable and a low yield group 812 of the reference explanatory variable. The high yield group 811 of the reference explanatory variable is a set of 10, and the low yield group 812 of the reference explanatory variable is also a set of 10.

It is counted how many of the respective lots of the bisected high yield group and low yield group of the explanatory variables coincide with the same group of the reference explanatory variable, which is designated as Na. For example, ST1, being the comparison explanatory variable 802, has 10 high yield groups included in the high yield group 811 of the reference explanatory variable, and two low yield groups included in the low yield group 812 of the reference explanatory variable. That is to say, the number of ST1 serving as the comparison explanatory variable, and ST3 serving as the reference explanatory variable belonging to the same group, Na=10+2=12.

An equation in which the above Na is substituted for the equation (5) is shown in a calculating formula 813 of the bisected confounding degree. Here, the number N of data is 20. This calculation result is shown in the bisected confounding degree 814. The value obtained by the equation (6) is shown as the bisected independence degree 815. The bisected confounding degree 814 and the bisected independence degree 815 are shown under each column in FIG. 47.

The basic usage of the bisected confounding degree and the bisected independence degree is three described below. The explanatory variables which have heretofore been difficult to discriminate can be obtained as quantitative information as described below.

(1) To Confirm the Range of Significant Explanatory Variable,

A candidate confounding with a candidate having high significant difference is caught, to be judged also as a significant explanatory variable. There is no specific standard for the confounding degree, but it can be judged by comparing it with a value of other explanatory variable. In the case where a candidate which need not be considered technically to be an object comes to the upper ranking, a candidate confounding with this candidate can be clarified. Further, a candidate having no meaning can be eliminated, to repeat the analysis for confirmation.

(2) To Confirm a Candidate Having High Independence Degree and its Application

The independence degree of all the candidates from other candidates is confirmed, and in the case where there is a candidate having sufficiently high independence degree from other candidates, it can be made clear that a yield difference of this candidate exists independently of other candidates. Further, by performing the similar discriminant tree analysis for each bisected group of this candidate for comparison, and in the case where similar analysis results are obtained for both of the bisected groups, it is understood that the reliability of the analysis result is high. On the contrary, when the analysis results are different, it is considered that there may be an explanatory variable affecting the yield under complex condition with a candidate which is considered to be independent, or the result is affected by a peculiar data (caused by few number of data, or the like).

(3) Discriminant Tree Analysis Related to a Confounding Candidate,

In the case where a candidate which is considered to be significant is confounding with a first branch candidate, this candidate hardly appears in the branch in the lower layer of the first branch. At this time, the discriminant tree analysis is performed by dividing the data by an other bisected group having high independence degree, to compare the result of the discriminant tree analysis under this bisected group. If similar results are obtained, the significant candidate cannot be discriminated from the first candidate, but the analysis itself can be considered to be highly reliable. On the contrary, in the case where the candidate which is considered to be significant appears with a different result, this result should be also taken into consideration, and it is considered to be necessary to perform other data analysis which can analyze the candidate which is considered to be significant discriminatingly from the first candidate.

A case where a regression tree analysis is performed, designating the apparatus history and the electric characteristic value as explanatory variables, and the wafer yield as the target variable, to determine the bisected confounding degree and the bisected independence degree with respect to the upper-ranking twelve candidates in the first branch in the results of the regression tree analysis will be explained next.

Figure 48:
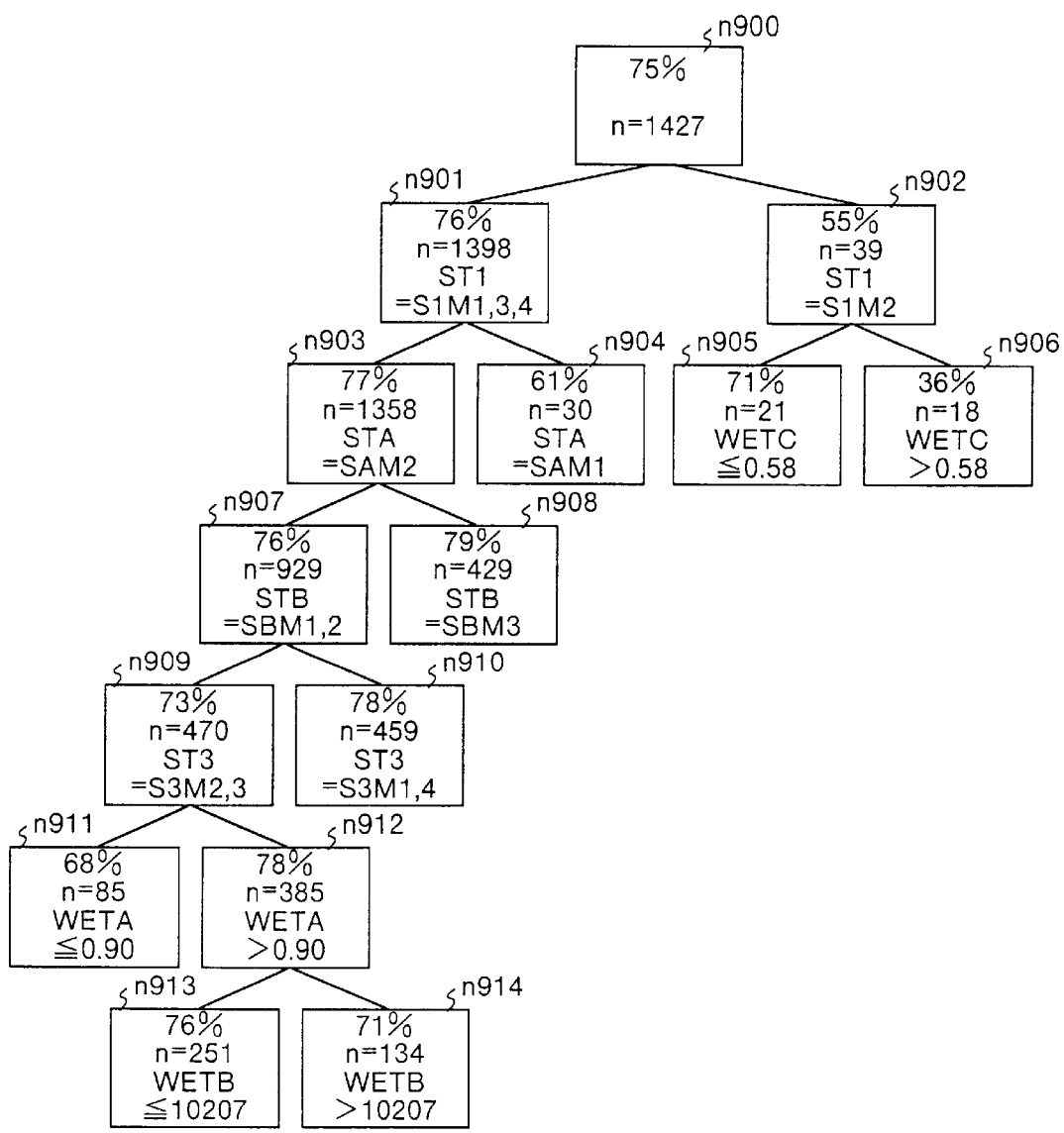
FIG. 48 is a diagram showing an example of the regression tree.

The regression tree diagram and the statistic list for evaluation obtained in the second embodiment are shown in FIG. 48 and FIG. 49. In FIG. 48, node n900 is divided into node n901 to node n914. FIG. 49 shows a statistic for evaluation of explanatory variables in the upper twelve rankings at the time of the first bisection. Thereby, twelve candidates 1001 to 1012 of the set branch are found.

FIG. 50 shows bisected confounding degree 1111 and bisected independence degree 1112, at the time of designating ST1 found as the first candidate 1001 at the highest ranking in FIG. 49 as the reference explanatory variable 1101, and other explanatory variables in the statistic list for evaluation as the comparison explanatory variables 1102.

FIG. 51 shows bisected confounding degree 1211 and bisected independence degree 1212, at the time of designating ST3 found as the third candidate 1003 for a set branch in FIG. 49 as the reference explanatory variable 1201, and other explanatory variables in the statistic list for evaluation as the comparison explanatory variables 1202.

The ones in which the bisected confounding degree exceeds 0.75 shown in FIG. 50 are ST2, ST4, ST5, ST6, ST10 and WET2, and these do not appear in the regression tree in FIG. 48, but there is a possibility that these may be a factor largely affecting the yield. On the contrary, it is indicated that ST3 has a high bisected independence degree.

FIG. 51 shows the bisected confounding degree 1211 and the bisected independence degree 1212 with respect to other eleven explanatory variables, designating ST3 found to have high bisected independence degree in FIG. 50 as the reference explanatory variable. ST3 shows that it has high independence degree from any other explanatory variables.

FIG. 52 and FIG. 53 show the bisected confounding degree and the bisected independence degree between the upper twelve explanatory variables, which are found to have a large significant difference in the regression tree analysis in FIG. 49, and the mean value thereof, thereby the relation between variables can be understood at a glance. The lowermost column in FIG. 52 shows the mean value 1301 of the bisected confounding degree, and the lowermost column in FIG. 53 shows the mean value 1401 of the bisected independence degree.

Since it has been found that a difference in the used apparatus in ST3 affects the yield independently of other explanatory variables, the regression tree analysis is performed separately, by dividing the wafers into a wafer group by means of the apparatus group in ST3 where the yield is defective (defective wafer group, using S3M2 and S3M3), and a wafer group by means of the apparatus group in ST3 where the yield is excellent (excellent wafer group, using S3M1 and S3M4). The regression tree diagram as the result thereof is shown in FIG. 54 and FIG. 55.

Figure 54:
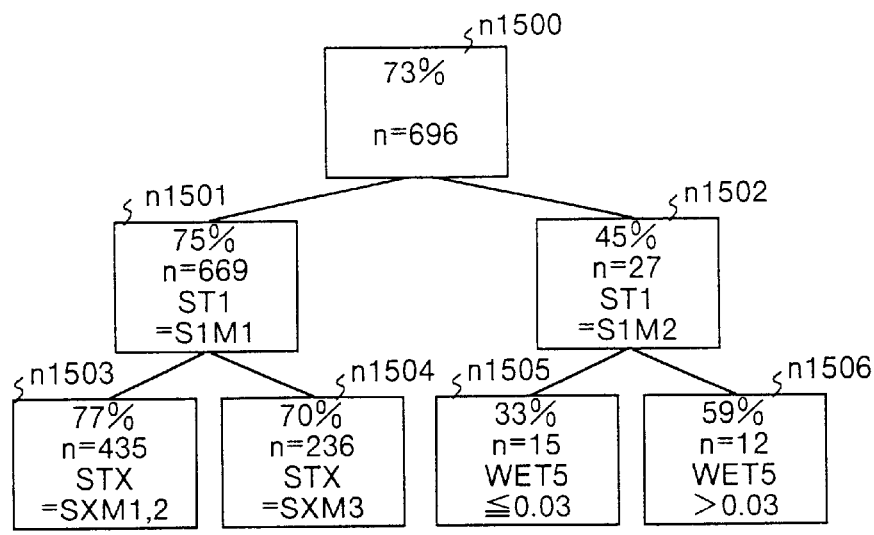
FIG. 54 is a regression tree diagram showing the result of the regression tree analysis by means of a defective wafer group.
Figure 55:
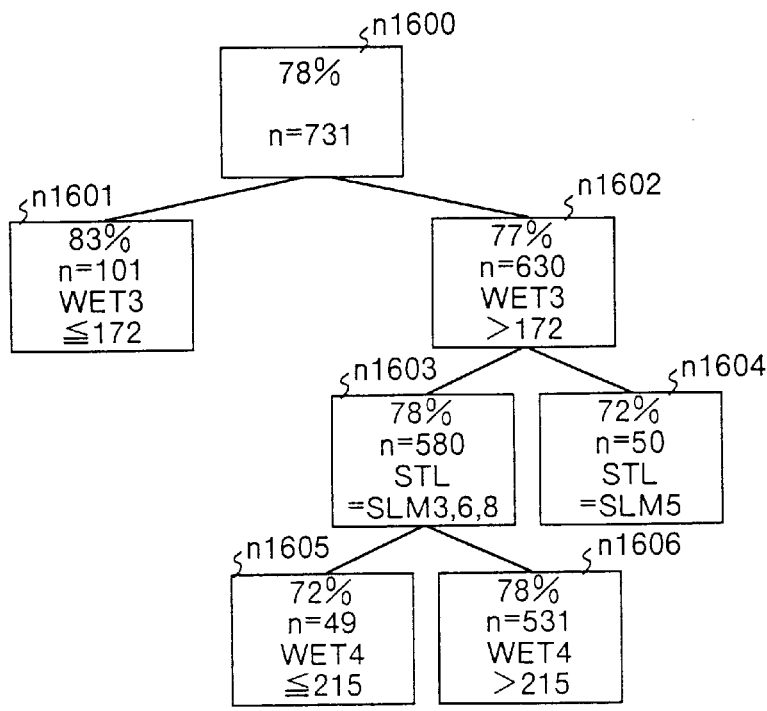
FIG. 55 is a regression tree diagram showing the result of the regression tree analysis by means of an excellent wafer group.

FIG. 54 is a regression tree diagram showing the result of the regression tree analysis using the defective wafer group, and constituted by node n1500 to node n1506. FIG. 55 is a regression tree diagram showing the result of the regression tree analysis using the excellent wafer group, and constituted by node n1600 to node n1606.

The first branch in the defective wafer group in FIG. 54 is the same with the whole wafer group in FIG. 48. It is presumed that the yield is considerably affected by a wafer extremely defective compared to other wafers, taking into consideration that the defective wafer group in the uppermost layer in the regression tree diagram in FIG. 48 is few, such as n=39, which is one factor making the analysis difficult. In the excellent wafer group in FIG. 55, it is seen that a factor which can be hardly seen due to the defective apparatus in ST3 step has been newly found.

According to the second embodiment, the confounding degree of the explanatory variables can be grasped more clearly, using the bisected confounding degree and the bisected independence degree. As a result, by combining it with the regression tree analysis, a noteworthy explanatory variable which confounds with a problematic explanatory variables having a large significant difference at the first branch in the regression tree can be made clear.

Further, it becomes possible to improve the accuracy (reliability) and the analysis efficiency of the regression tree analysis and perform more detailed analysis, by performing the regression tree analysis again, by applying grouping of explanatory variables having a high independence degree.

The above-described embodiments can be realized by a computer which executes the program. Further, a unit which supplies the program to the computer, for example, a recording medium such as a CD-ROM or the like which stores such a program, or a transmission medium such as the Internet for transmitting such a program can be applied as an embodiment of the present invention. The above-described program, recording medium and transmission medium are included in the scope of the present invention.

Any of the above-described embodiments show only an example of materialization, at the time of executing the present invention, and the technical range of the present invention is not limited thereto. That is, the present invention can be executed in various forms, without departing from the technical idea or the primary characteristics thereof.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A data analysis method comprising the steps of:
quantitatively evaluating and extracting at least one data distribution characteristic amount existing in an original data group, by editing the original data value;
selecting an optional data distribution characteristic amount from the at least one data distribution characteristic amount extracted and performing an analysis; and
making a decision based on a result of the analysis.

2. The data analysis method according to claim 1, wherein the at least one data distribution characteristic amount extracted is shown in a continuous value representing the degree of characteristic.

3. The data analysis method according to claim 1, wherein each of the at least one data distribution characteristic amount extracted is independent of each other, for each record.

4. The data analysis method according to claim 1, wherein the analysis is performed by data mining in which the at least one data distribution characteristic amount extracted is designated as a target variable.

5. The data analysis method according to claim 4, wherein each of the at least one individual data distribution characteristic amount extracted is stored in a file for each record, and the same data distribution characteristic amount is sequentially selected from the file, with respect to a part of or all of the records, and designated as the target variable, to perform a regression tree analysis.

6. The data analysis method according to claim 1, wherein each step is automatically performed by a computer system which executes software incorporated therein so as to be performed sequentially.

7. The data analysis method according to claim 1, wherein one of the at least one data distribution characteristic amount extracted is a value "a" of a y-axis section at the time of approximating the relation between x and y to a linear equation $y = b \cdot x + a$, designating an order of the original data array as x, and an original data value as y.

8. The data analysis method according to claim 1, wherein one of the at least one data distribution characteristic amount extracted is a value "b" of an inclination at the time of approximating the relation between x and y to a linear equation $y = b \cdot x + a$, designating an order of the original data array as x, and an original data value as y.

9. The data analysis method according to claim 1, wherein one of the at least one data distribution characteristic amount extracted is a specific periodicity strength of the original data value with respect to the order of the original data array.

10. The data analysis method according to claim 1, wherein one of the at least one data distribution characteristic amount extracted is a value indicating the strongest periodicity of the original data value with respect to the order of the original data array.

11. A data analysis method comprising the steps of:
quantitatively evaluating and extracting at least two data distribution characteristic amounts existing in an original data group, by editing the original data value;
sequentially selecting the individual data distribution characteristic amounts extracted and performing an analysis; and
making a decision based on a result of the analysis.

12. The data analysis method according to claim 11, wherein the data distribution characteristic amounts extracted are each shown in a continuous value representing the degree of characteristic.

13. The data analysis method according to claim 11, wherein each of the data distribution characteristic amounts extracted is independent of each other, for each record.

14. The data analysis method according to claim 11, wherein the analysis is performed by data mining in which at least one of the data distribution characteristic amounts extracted is designated as a target variable.

15. The data analysis method according to claim 14, wherein each of the data distribution characteristic amounts extracted is stored in a file for each record, and the same data distribution characteristic amount is sequentially selected from the file, with respect to a part of or all of the records, and designated as the target variable, to perform a regression tree analysis.

16. The data analysis method according claim 11, wherein each step is automatically performed by a computer system which executes software incorporated therein so as to be performed sequentially.

17. The data analysis method according to claim 11, wherein one of the at least two data distribution characteristic amounts extracted is a value "a" of a y-axis section at the time of approximating the relation between x and y to a linear equation y=b·x+a, designating an order of the original data array as x, and an original data value as y.

18. The data analysis method according to claim 11, wherein one of the at least two data distribution characteristic amounts extracted is a value "b" of an inclination at the time of approximating the relation between x and y to a linear equation y=b·x+a, designating an order of the original data array as x, and an original data value as y.

19. The data analysis method according to claim 11, wherein one of the at least two data distribution characteristic amounts extracted is a specific periodicity strength of the original data value with respect to the order of the original data array.

20. The data analysis method according to claim 11, wherein one of the at least two data distribution characteristic amounts extracted is a value indicating the strongest periodicity of the original data value with respect to the order of the original data array.

21. A data analysis method comprising:
(a) a step of preparing a data result of an explanatory variable and a target variable;
(b) a step of calculating the confounding degree and/or the independence degree between a plurality of explanatory variables based on the data result; and
(c) a step of performing data mining, using the confounding degree and/or the independence degree.

22. The data analysis method according to claim 21, wherein the step (b) calculates the confounding degree and/or the independence degree in a unit of set bisected by a regression tree analysis.

23. The data analysis method according to claim 22, wherein the step (b) selects a plurality of explanatory variables which becomes a factor causing a bisection having a large significant difference by the regression tree analysis, and calculates the confounding degree and/or the independence degree between the plurality of explanatory variables.

24. The data analysis method according to claim 23, wherein the step (b) calculates the confounding degree and/or the independence degree based on a ratio of agreement of data to disagreement of data between explanatory variables in each set bisected by the regression tree analysis, at the time of calculating the confounding degree and/or the independence degree between a reference explanatory variable and other explanatory variables.

25. The data analysis method according to claim 24, wherein the step (c) performs data mining by picking up an explanatory variables based on the confounding degree and/or the independence degree.

26. A data analysis apparatus comprising:
a calculation unit which calculates a confounding degree and/or an independence degree between a plurality of explanatory variables, based on the data result of the explanatory variables and a target variable; and
a data mining unit which performs data mining by using the confounding degree and/or the independence degree.

27. The data analysis apparatus according to claim 26, wherein the calculation unit calculates the confounding degree and/or the independence degree in a unit of set bisected by means of a regression tree analysis.

28. The data analysis apparatus according to claim 27, wherein the calculation unit selects a plurality of explanatory variables which becomes a factor causing a bisection having a large significant difference by the regression tree analysis, and calculates the confounding degree and/or the independence degree between the plurality of explanatory variables.

29. The data analysis apparatus according to claim 27, wherein the calculation unit calculates the confounding degree and/or the independence degree based on a ratio of agreement of data to disagreement of data between explanatory variables in each set bisected by the regression tree analysis, at the time of calculating the confounding degree and/or the independence degree between a reference explanatory variable and other explanatory variables.

30. The data analysis apparatus according to claim 29, wherein the data mining unit performs data mining by picking up an explanatory variables based on the confounding degree and/or the independence degree.

31. A computer readable recording medium which records a program for a computer to execute, the program comprising:
(a) a procedure of preparing a data result of an explanatory variable and a target variable;
(b) a procedure of calculating the confounding degree and/or the independence degree between a plurality of explanatory variables based on the data result; and
(c) a procedure of performing data mining, using the confounding degree and/or the independence degree.

* * * * *